US011317512B2

(12) United States Patent
Ha et al.

(10) Patent No.: US 11,317,512 B2
(45) Date of Patent: Apr. 26, 2022

(54) ELECTRONIC DEVICE INCLUDING INTERPOSER

(71) Applicant: Samsung Electronics Co., Ltd., Suwon-si (KR)

(72) Inventors: Sangwon Ha, Suwon-si (KR); Seyoung Jang, Suwon-si (KR); Sungjin Kim, Suwon-si (KR); Sanghoon Park, Suwon-si (KR); Kyungho Lee, Suwon-si (KR); Younoh Chi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/883,604

(22) Filed: May 26, 2020

(65) Prior Publication Data

US 2021/0014970 A1 Jan. 14, 2021

(30) Foreign Application Priority Data

Jul. 10, 2019 (KR) .......................... 10-2019-0083250

(51) Int. Cl.
*H05K 1/14* (2006.01)
*H01L 25/065* (2006.01)
(52) U.S. Cl.
CPC ......... *H05K 1/144* (2013.01); *H01L 25/0657* (2013.01); *H05K 1/142* (2013.01)
(58) Field of Classification Search
CPC .................................................. H01L 25/0657
See application file for complete search history.

(56) References Cited

U.S. PATENT DOCUMENTS

| 7,613,010 B2 | 11/2009 | Ono et al. |
| 8,704,384 B2 | 4/2014 | Wu et al. |

(Continued)

FOREIGN PATENT DOCUMENTS

| DE | 102013221120 A1 | 4/2015 |
| JP | 2014130855 A | 7/2014 |

(Continued)

OTHER PUBLICATIONS

IPhone 11 Pro Max exploded view—iFixit, dated Sep. 12, 2019, https://ko.ifixit.com/Teardown/iPhone+11+Pro+Max+Teardown/12600.

(Continued)

*Primary Examiner* — William A Harriston
(74) *Attorney, Agent, or Firm* — Jefferson IP Law, LLP

(57) ABSTRACT

An electronic device is provided that includes a first circuit board including a first electronic component and a second electronic component disposed on a side of the first circuit board, a second circuit board spaced apart from the first circuit board and having a side facing the side of the first circuit board on which the first electronic component and the second electronic component are disposed, a first interposer disposed between the first circuit board and the second circuit board to form an inner space between the first circuit board and the second circuit board, and a second interposer disposed between the first circuit board and the second circuit board to divide the inner space into a first region and a second region, wherein the first electronic component on the first circuit board is disposed corresponding to the first region, and the second electronic component on the first circuit board is disposed corresponding to the second region, and wherein the first interposer and the second interposer electrically connect the first circuit board to the second circuit board.

19 Claims, 16 Drawing Sheets

(56) References Cited

U.S. PATENT DOCUMENTS

| | | | |
|---|---|---|---|
| 9,087,765 | B2 | 7/2015 | Chun et al. |
| 10,342,131 | B1 | 7/2019 | Kim et al. |
| 2004/0264156 | A1 | 12/2004 | Ajioka et al. |
| 2007/0178763 | A1* | 8/2007 | Yang .................... H05K 9/0024 439/607.35 |
| 2013/0201648 | A1* | 8/2013 | Cheng .................... H05K 1/144 361/803 |
| 2015/0287672 | A1 | 10/2015 | Yazdani |
| 2018/0063940 | A1* | 3/2018 | Railkar ................ H05K 1/0204 |
| 2018/0068938 | A1 | 3/2018 | Yazdani |
| 2018/0220051 | A1 | 8/2018 | Yoneyama |
| 2019/0082535 | A1 | 3/2019 | Myers et al. |
| 2019/0082536 | A1 | 3/2019 | Park et al. |
| 2019/0103346 | A1 | 4/2019 | Goh et al. |
| 2019/0319381 | A1 | 10/2019 | Bang et al. |
| 2020/0037437 | A1* | 1/2020 | Hong ..................... H05K 1/186 |
| 2020/0093040 | A1 | 3/2020 | Yun et al. |

FOREIGN PATENT DOCUMENTS

| | | |
|---|---|---|
| KR | 10-2014-0078197 A | 6/2014 |
| KR | 10-2014-0082305 A | 7/2014 |
| KR | 10-1537390 B1 | 7/2015 |
| KR | 10-2019-0029215 A | 3/2019 |
| KR | 10-2019-0119819 A | 10/2019 |
| KR | 10-2019-0139597 A | 12/2019 |
| KR | 10-2020-0032911 A | 3/2020 |

OTHER PUBLICATIONS

International Search Report and written opinion dated Sep. 4, 2020, issued in International Application No. PCT/KR2020/006857.
European Search Report dated Oct. 28, 2020, issued in European Application No. 20177445.2.

* cited by examiner

ELECTRONIC DEVICE INCLUDING INTERPOSER

CROSS-REFERENCE TO RELATED APPLICATION(S)

This application is based on and claims priority under 35 U.S.C. § 119(a) of a Korean patent application number 10-2019-0083250, filed on Jul. 10, 2019, in the Korean Intellectual Property Office, the disclosure of which is incorporated by reference herein in its entirety.

BACKGROUND

1. Field

The disclosure relates to an electronic device including an interposer. More particularly, the disclosure relates to an electronic device including an interposer formed in a multi-step or partition structure.

2. Description of Related Art

In order for electronic devices to be conveniently used by users and to have an aesthetically pleasing appearance, a thickness of electronic devices is being gradually reduced. The inner space in electronic devices is therefore becoming limited and thus use of a structure in which different types of printed circuit boards (PCBs) are laminated is increasing for efficient use of the inner space in the electronic devices.

When a millimeter wave (mmWave) module is applied to a portable electronic device, the portable electronic device may include an interposer including a conductive member in order to secure space for mounting electronic components or various active elements.

The above information is presented as background information only to assist with an understanding of the disclosure. No determination has been made, and no assertion is made, as to whether any of the above might be applicable as prior art with regard to the disclosure.

SUMMARY

An interposer may electrically connect substrates to each other. The interposer is formed to have a predetermined height and there may be the difference between the height of electronic components mounted on substrates and the height of the space between the substrates. Arranging substrates in consideration of the various heights of electronic components is difficult and thus space may be wasted.

The interposer may be formed in a closed-curve shape along the edge of a substrate so as to correspond to the shape of at least part of the substrate. Since the interposer supports the edge of the substrate, a region that is not supported by the interposer is vulnerable to bending or warping due to stress. Therefore, there is the need for method capable of reducing limitations due to the height or thickness of electronic components and of preventing warpage of a substrate.

Aspects of the disclosure are to address at least the above-mentioned problems and/or disadvantages and to provide at least the advantages described below. Accordingly, an aspect of the disclosure is to provide an electronic device including an interposer formed in a multi-step or partition structure so as to prevent the above-described warpage of a substrate.

Additional aspects will be set forth in part in the description which follows and, in part, will be apparent from the description, or may be learned by practice of the presented embodiments.

In accordance with an aspect of the disclosure, an electronic device is provided. The electronic device includes a first circuit board including a first electronic component and a second electronic component disposed on a side of the first circuit board, a second circuit board spaced apart from the first circuit board and having a side facing the side of the first circuit board on which the first electronic component and the second electronic component are disposed, a first interposer disposed between the first circuit board and the second circuit board to form an inner space between the first circuit board and the second circuit board, and a second interposer disposed between the first circuit board and the second circuit board to divide the inner space into a first region and a second region, wherein the first electronic component on the first circuit board is disposed corresponding to the first region, and the second electronic component on the first circuit board is disposed corresponding to the second region, and wherein the first interposer and the second interposer electrically connect the first circuit board to the second circuit board.

In accordance with an aspect of the disclosure, an electronic device is provided. The electronic device includes a first circuit board, a first interposer disposed on the first circuit board and having a first height, a second circuit board disposed on the first interposer and electrically connected to the first interposer, a second interposer disposed on the first circuit board so as to be formed outside the first interposer and having a second height, and a third circuit board disposed on the second interposer and electrically connected to the second interposer.

In accordance with another aspect of the disclosure, an electronic device is provided. The electronic device includes a first circuit board, a first interposer disposed on the first circuit board and having a first height, a second circuit board disposed on the first interposer and electrically connected to the first interposer, and a partition disposed inside the first interposer and formed to support at least a portion of the second circuit board.

In accordance with another aspect of the disclosure, an electronic device is provided. The electronic device includes a first circuit board which includes a first surface, on which at least one component is disposed and which faces in a first direction, and a second surface facing in the opposite direction of the first direction, a first interposer which is disposed on the first surface of the first circuit board, is electrically connected to the first circuit board, and includes a first region having a first height with reference to the first surface of the first circuit board and a second region having a second height with reference to the first surface, a second interposer which is disposed on the first surface of the first circuit board, is electrically connected to the first circuit board, and includes a third region having the first height with reference to the first surface of the first circuit board, a second circuit board which faces the first surface of the first circuit board and is disposed on the first region of the first interposer and on the third region of the second interposer, and a third circuit board which faces the first surface of the first circuit board and is disposed on the second region of the first interposer.

In accordance with another aspect of the disclosure, an electronic device including an interposer can laminate multiple substrates and thus can increase efficiency of use of space in the vertical direction.

In accordance with another aspect of the disclosure, an electronic device including an interposer is provided. The electronic device includes a partition capable of supporting a substrate and thus can prevent warpage of the substrate. The electronic device enables electronic components to be disposed in regions separated by the partition, and thus can reduce signal interference therebetween.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
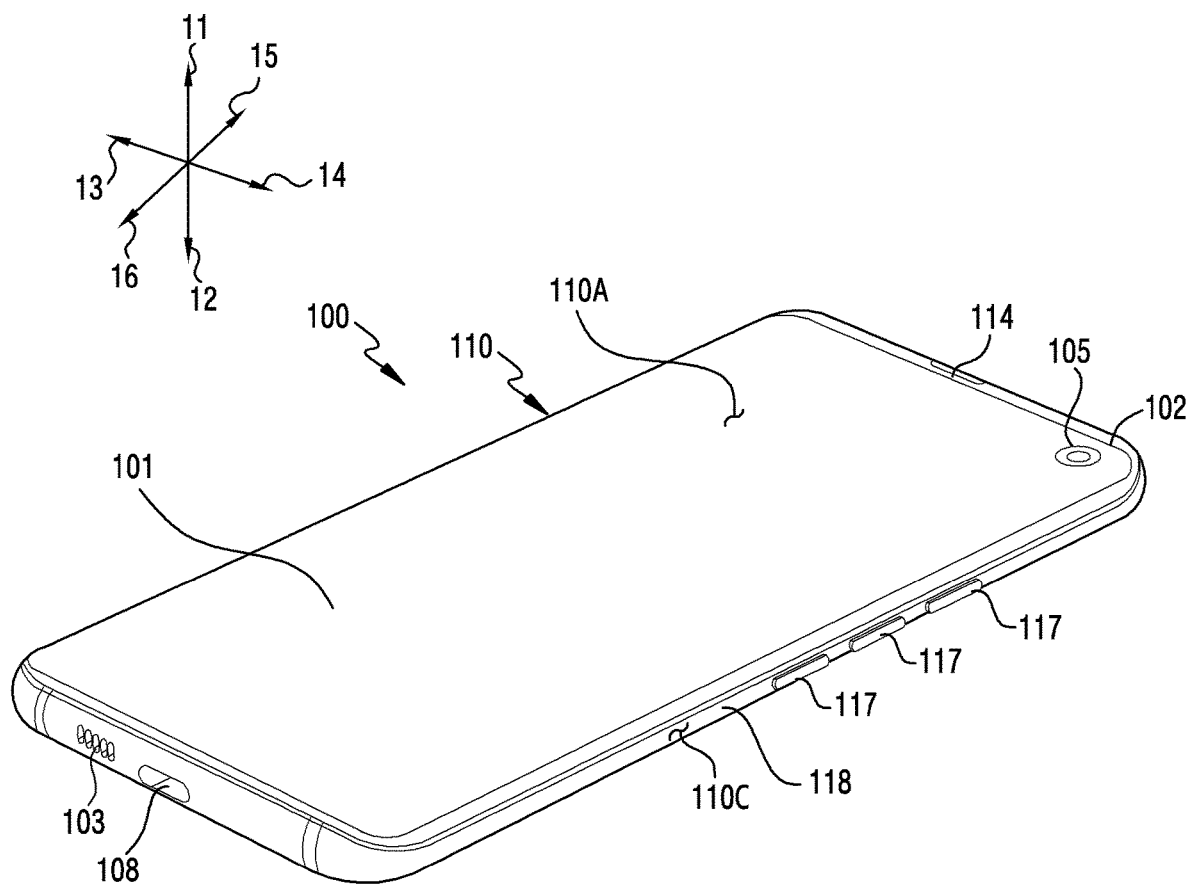
FIG. 1 is a perspective view showing an electronic device according to an embodiment of the disclosure.

FIG. 1 is a perspective view showing an electronic device 100 when seen from the front according to an embodiment of the disclosure.

Figure 2:
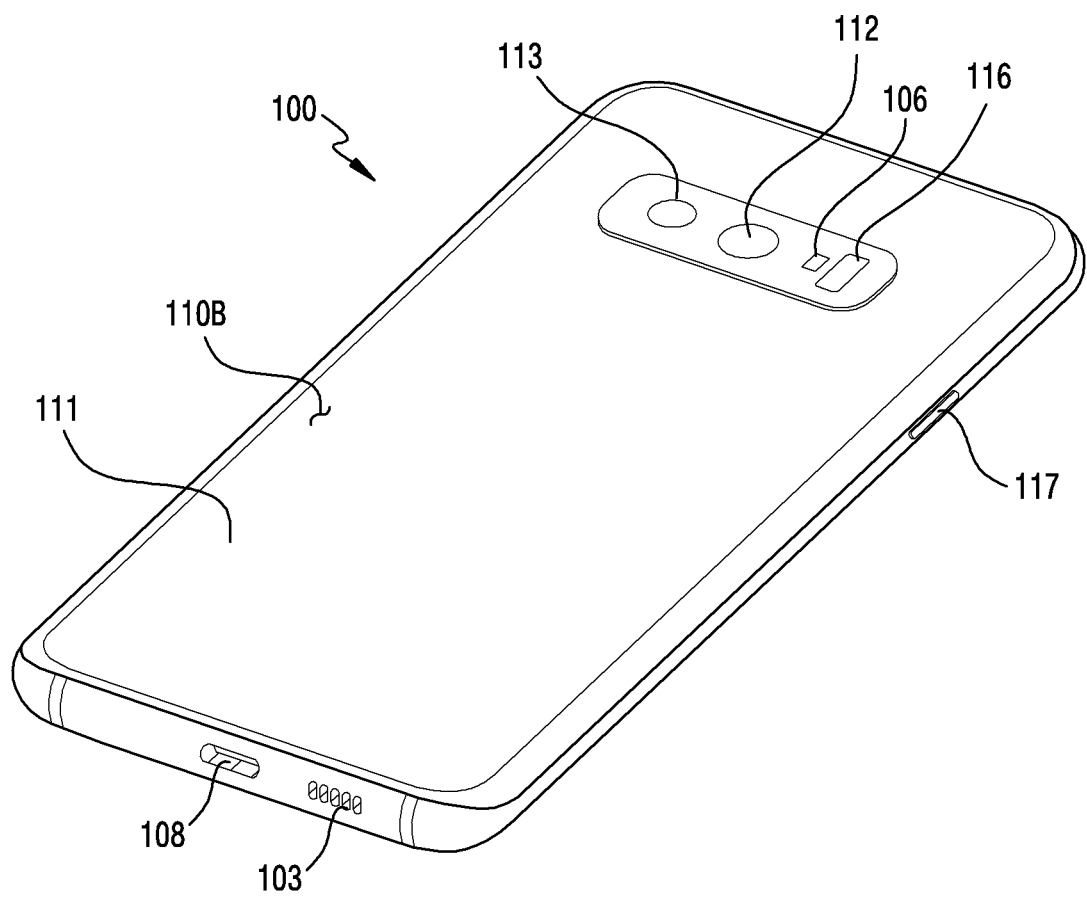
FIG. 2 is a perspective view of the electronic device of FIG. 1 when seen from the rear according to an embodiment of the disclosure.

FIG. 2 is a perspective view of the electronic device 100 of FIG. 1 when seen from the rear according to an embodiment of the disclosure.

Referring to FIGS. 1 and 2, an electronic device 100 according to an embodiment may include: a housing 110 including a first face (or a front face) 110A, a second face (or a rear face) 110B, and a side face 110C surrounding the space between the first face 110A and the second face 110B. In another embodiment (not illustrated), the term "housing" may refer to a structure forming some of the first face 110A, the second face 110B, and the side face 110C of FIG. 1.

According to an embodiment, at least a portion of the first face 110A may be formed of a substantially transparent front plate 102 (e.g., a glass plate or a polymer plate including various coating layers). According to embodiments, the front plate 102 may have a curved portion bending and seamlessly extending from a first face 110A to a rear plate 111 at least at a side edge portion.

According to embodiments, the second face 110B may be formed of a substantially opaque rear plate 111. The rear plate 111 may be formed of, for example, and without limitation, coated or colored glass, ceramic, a polymer, a metal (e.g., aluminum, stainless steel (STS), or magnesium), or a combination of two or more of these materials. According to an embodiment, the rear plate 111 may have a curved portion bending and seamlessly extending from the second face 110B to the front plate 102 at least at a side edge portion.

According to various embodiments, the side 110C is combined with a front plate 102 and a rear plate 111 and may be formed by a lateral bezel structure 118 (or a "lateral member or a side wall") including metal and/or a polymer. In an embodiment, the rear plate 111 and the lateral bezel structure 118 may be integrated and may include the same material (e.g., a metallic material such as aluminum).

According to an embodiment, the electronic device 100 may include at least one of a display 101, audio modules 103 and 114, sensor modules, camera modules 105, key input devices 117, and connector holes 108. In some embodiments, in the electronic device 100, at least one of the components (e.g., the key input devices 117) may be omitted, or other components may be additionally included.

For example, an electronic device 100 may include a sensor module not shown. For example, a sensor including a proximity sensor or an illumination sensor may be integrated with a display 101 or may be disposed adjacent to the display 101 in a region that is provided by the front plate 102. In an embodiment, the electronic device 100 may further include a light emitting element and the light emitting element may be disposed adjacent to the display 101 in the region that is provided by the front plate 102. The light emitting element, for example, may provide state information of the electronic device 100 in a light type. In another embodiment, the light emitting element, for example, may provide a light source that operates with the operation of a camera module 105. The light emitting element, for example, may include a light-emitting diode (LED), an infrared (IR) LED, and a xenon lamp.

The display 101 may be exposed through, for example, a large portion of the front plate 102. In some embodiments, the edges of the display 101 may be formed to be substantially the same as the contour shape of the front plate 102 adjacent thereto. In another embodiment (not shown), the distance between the outer contour of the display 101 and the outer contour of the front plate 102 may be substantially constant in order to enlarge the exposed area of the display 101.

In another embodiment (not shown), a recess or an opening may be formed in a portion of a display region of the display 101, and other electronic devices aligned with the recess or the opening such as a camera module 105 and a proximity sensor or an illumination sensor (not shown) may be included.

In another embodiment (not shown), at least one of the camera modules 112 and 113, the fingerprint sensor 116, and the light-emitting element 106 may be included in the rear face of the screen display area of the display 101. In another embodiment (not shown), the display 101 may be coupled to or disposed adjacent to a touch-sensing circuit, a pressure sensor that is capable of measuring the intensity of the touch (pressure), and/or a digitizer that detects a magnetic-field-type stylus pen.

The audio modules 103 and 114 may include a microphone hole and speaker holes. The microphone hole may include a microphone disposed therein so as to acquire external sound, and in some embodiments, multiple microphones may be disposed therein so as to detect the direction of sound. In some embodiments, the speaker holes and the microphone hole may be implemented as a single hole 103, or a speaker may be included therein without the speaker holes (e.g., a piezo speaker). The speaker holes may include an external speaker hole and a phone call receiver hole 114.

The electronic device 100 may include a one or more sensor modules (not shown) to generate electrical signals or data values corresponding to the internal operating state or the external environmental state of the electronic device 100. The sensor modules may include, for example, a proximity sensor disposed on the first face 110A of the housing, a fingerprint sensor integrated or adjacent to the display 101, and/or heart rate monitor (HRM) sensor disposed on the second face 110B of the housing 110. The electronic device 100 may further include at least one of sensors (not shown) such as, for example, and without limitation, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, an illuminance sensor, or the like.

The camera modules 105, 112, 113, and 106 may include a first camera device 105 disposed on the first face 110A of the electronic device 100 and a second camera device 112 and 113 disposed on the second face 110B, and/or a flash 106. The camera devices 105, 112 and 113 may include one or more lenses, an image sensor, and/or an image signal processor. The flash 106 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 117 may be disposed on the side faces 110C of the housing 110. In another embodiment, the electronic device 100 may not include some or all of the above-mentioned key input devices 117, and a key input device 117, which is not included therein, may be implemented in another form, such as that of a soft key or the like on the display 101. In some embodiments, the key input devices may include a sensor module 116 disposed on the second face 110B of the housing 110.

The connector holes 108 may be capable of accommodating a connector for transmitting and receiving power and/or data to and from an external electronic device, and/or a connector for transmitting and receiving an audio signal to and from an external electronic device. For example, the connector holes 108 may include universal serial bus (USB) connector or earphone jack.

Figure 3:
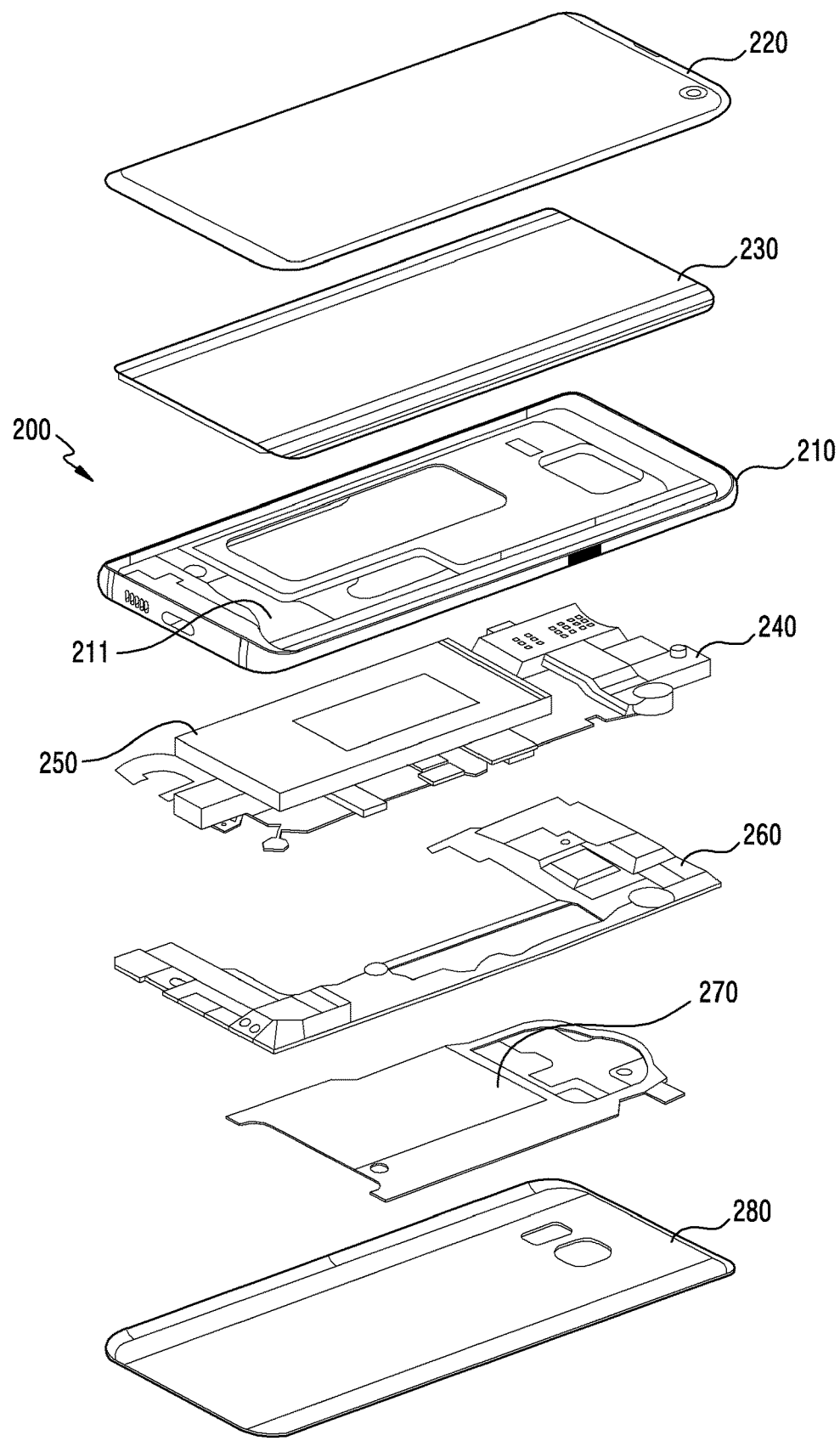
FIG. 3 is an exploded perspective view of the electronic device of FIG. 1 according to an embodiment of the disclosure.

FIG. 3 is an exploded perspective view of the electronic device of FIG. 1 according to an embodiment of the disclosure.

Referring to FIG. 3, an electronic device 200 may include a side bezel structure 210, a first support member 211 (e.g., a bracket), a front plate 220, a display 230, a PCB 240, a battery 250, a second support member 260 (e.g., a rear case), an antenna 270, and a rear plate 280. In some embodiments, at least one of the components (e.g., the first support member 211 or the second support member 260) may be omitted from the electronic device 200, or the electronic device 200 may additionally include other components. At least one of the components of the electronic device 200 may be the same as or similar to at least one of the components of the electronic device 100 of FIG. 1 or FIG. 2, and a redundant description may not be repeated here.

The first support member 211 may be disposed inside the electronic device 200 and may be connected to the side bezel structure 210, or may be formed integrally with the side bezel structure 210. The first support member 211 may include, for example, a metal material and/or a non-metal (e.g., polymer) material. The display 230 may be coupled to one face of the first support member 211, and the PCB 240 may be coupled to the other face of the first support member 332. On the PCB 240, a processor, a memory, and/or an interface, or the like, may be mounted. The processor may include various processing circuitry including at least one of, for example, and without limitation, a central processing unit, an application processor, a graphic processor, an image signal processor, a sensor hub processor, a communication processor, or the like.

The memory may include, for example, volatile memory and/or nonvolatile memory.

The interface may include, for example, and without limitation, a high-definition multimedia interface (HDMI), a universal serial bus (USB) interface, a secure digital (SD) card interface, and/or an audio interface, or the like. The interface may electrically or physically connect, for example, the electronic device 200 to an external electronic device, and may include, for example, and without limitation, a USB connector, an SD card/a multimedia card (MMC) connector, an audio connector, or the like.

The battery 250 is a device for supplying power to at least one component of the electronic device 200, and may include, for example, and without limitation, a non-rechargeable primary battery, a rechargeable secondary battery, a fuel cell, or the like. At least a portion of the battery 250 may be disposed to be substantially flush with, for example, the PCB 240. The battery 250 may be integrally disposed within the electronic device 200, or may be detachably mounted on the electronic device 200.

The antenna 270 may be disposed between the rear plate 280 and the display 230. The antenna 270 may include, for example, and without limitation, a near-field communication (NFC) antenna, a wireless charging antenna, and/or a magnetic secure transmission (MST) antenna, or the like. The antenna 270 may perform short-range communication with, for example, an external electronic device, or may transmit/receive power used for charging to/from the external device in a wireless manner. In another embodiment, an antenna structure may be formed by the side bezel structure 210, a portion of the first support member 211, or a combination thereof.

Figure 4:
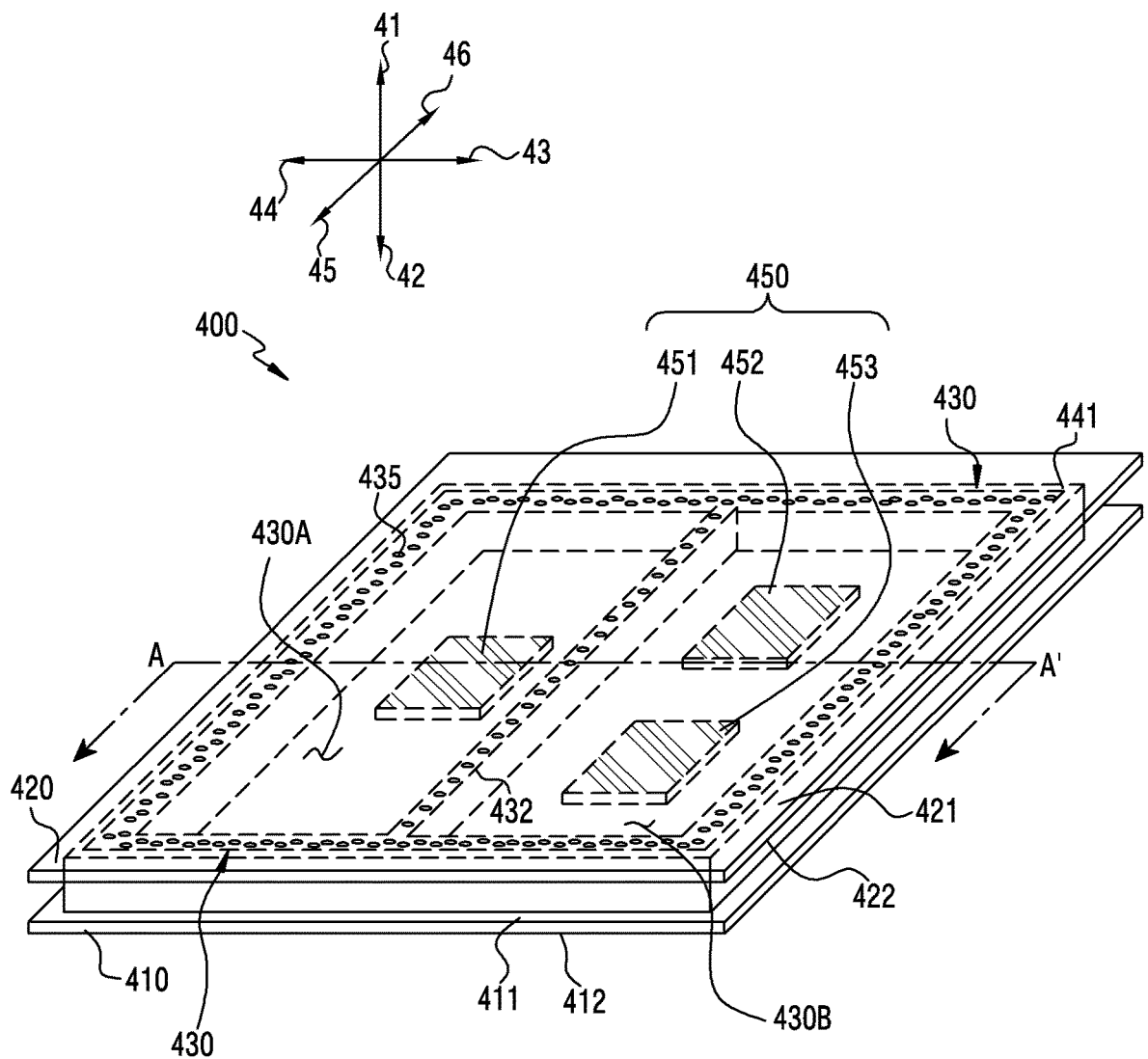
FIG. 4 is a perspective view illustrating a circuit board on which an interposer including a partition is disposed according to an embodiment of the disclosure.

FIG. 4 is a perspective view illustrating a circuit board on which an interposer including a partition is disposed according to an embodiment of the disclosure.

Figure 5:
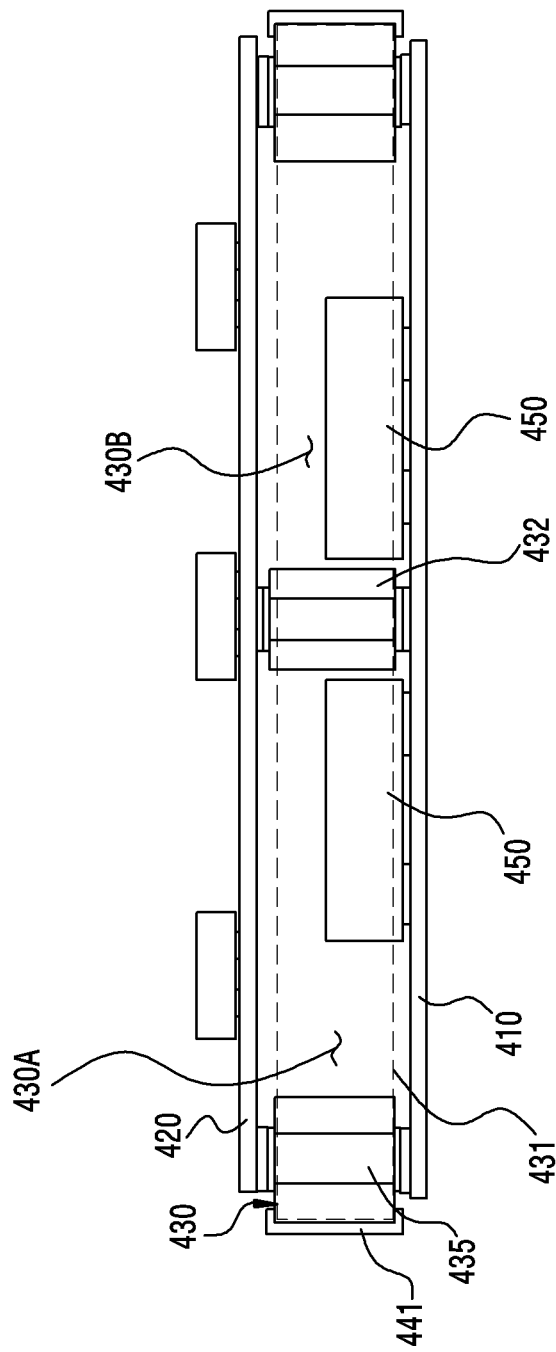
FIG. 5 is a cross-sectional view taken by cutting the circuit board of FIG. 4 in the direction A-A' according to an embodiment of the disclosure.

FIG. 5 is a cross-sectional view taken by cutting the circuit board of FIG. 4 in the direction A-A' according to an embodiment of the disclosure.

Referring to FIG. 4, an electronic device 400 may include a first circuit board 410 (e.g., the printed circuit board 240 in FIG. 3), a second circuit board 420, and a first interposer 430 forming an inner space between the first circuit board 410 and the second circuit board 420. The first interposer 430 may be formed as a closed curve surrounding the inner space formed in the first circuit board 410 and the second circuit board 420 in order to shield the inner space. The first interposer 430 may be formed in a shape in which a through-hole is formed in a prism having a polygonal base. In one example, the first interposer 430 may be formed in a shape in which one through-hole is formed in a square prism.

According to one embodiment, the electronic device 400 may include a second interposer 432 used as a partition. The second interposer 432 may be disposed across the inner space formed by the first interposer 430 to divide the inner space into two regions. In one example, the second interposer 432 may divide the inner space among the first interposer 430, the first circuit board 410, and the second circuit board 420 into a first region 430A and a second region 430B. In one example, the second interposer 432 may support at least one region of the second circuit board 420 (e.g., a second surface 422 of the second circuit board 420).

According to various embodiments, the first circuit board 410 may include a first surface 411 facing in a first direction 41 and a second surface 412 facing in a second direction 42. Various electronic components 450 (e.g., a processor, a modem chip, and various types of active elements) may be arranged on the first surface 411 of the first circuit board 410. The first circuit board 410 may include a ground and a wire for electrically connecting one or more electronic components 450. The second circuit board 420 may include a second surface 422 facing the first surface 411 of the first circuit board 410 and a first surface 421 facing in the opposite direction of the second surface 422 of the second circuit board 420.

According to one embodiment, electronic components may be arranged on the first surface 421 of the second circuit board 420. According to another embodiment, electronic components may be arranged on the second surface 422 of the second circuit board 420. The electronic components arranged on the second surface 422 of the second circuit board 420 may be arranged so as to be prevented from interfering with the electronic components 450 arranged on the first surface 411 of the first circuit board 410.

In various embodiments, the first interposer 430 may be arranged between the first circuit board 410 and the second circuit board 420 so as to surround the space between the first circuit board 410 and the second circuit board 420. Through the above-described arrangement of the first interposer 430, an inner space may be formed among the first interposer 430, the first circuit board 410, and the second circuit board 420.

In one embodiment, the second circuit board 420 may be disposed between the first circuit board 410 and a rear plate (e.g., the rear plate 280 in FIG. 3). That is, the second circuit board 420 may be disposed on the first surface 411 of the first circuit board 410 facing the rear plate 280 (e.g., in the direction 41 in FIG. 4). In one example, the second circuit board 420 may be an antenna substrate for radiating an RF signal. A communication module may be disposed on the first surface 421 of the second circuit board 420 facing the rear plate 280. In this case, the second circuit board 420 may be disposed between the first circuit board 410 and the rear plate 280 such that an RF signal radiated from an electronic component (e.g., a communication module) of the second circuit board 420 passes through at least a portion of the region of the rear plate 280.

In another embodiment, the second circuit board 420 may be disposed between the first circuit board 410 and a first support member (e.g., the support member 211 in FIG. 3). The second circuit board 420 may include one or more electric elements, a wire for electrically connecting the electric elements, and a ground.

In one embodiment, the first interposer 430 may be disposed between the first surface 411 of the first circuit board 410 and the second surface 422 of the second circuit board 420 so as to connect the first surface 411 to the second surface 422. The first interposer 430 may include at least one conductive member 435 for electrically connecting the first circuit board 410 or the at least one electronic component 450 arranged on the first circuit board 410 to the second circuit board 420 or at least one electronic component arranged on the second circuit board.

According to one embodiment, the first interposer 430 may include a plurality of wall portions formed of a non-conductive member and may include the at least one conductive member 435 (e.g., a conductive via) passing through the plurality of wall portions. In one embodiment, the plurality of wall portions may be disposed along peripheral portions of the first circuit board 410 and the second circuit board 420. By the structure of the plurality of wall portions of the first interposer 430, the inner space may be formed. For example, the inner space may be enclosed by the first circuit board 410, the second circuit board 420, and the first interposer 430. In one embodiment, at least one through-holes may be formed through the plurality of wall portions of the first interposer 430, and the at least one conductive member 435 may pass through the plurality of wall portions of the first interposer 430. For example, some of the conductive members 435 may be power lines, and the others thereof may be formed as signal transmission lines. The conductive member 435 may transmit electric power transferred from a battery (e.g., the battery 250 in FIG. 3) to at least one electronic component included in the first circuit board 410 or in the second circuit board 420, and may transmit or receive, to or from a processor, signals between electronic components arranged on the first circuit board 410 and on the second circuit board 420.

According to one embodiment, the second interposer 432 may include a wall portion formed of a non-conductive member, and may include at least one conductive member. In one embodiment, the wall portion of the second interposer 432 may be disposed across the inner space formed by the first circuit board 410, the second circuit board 420 and the first interposer 430. For example, the wall portion of the second interposer 432 extends from one of the plurality of the wall portions of the first interposer 430 to another one of the plurality of the wall portions of the first interposer 430. In one embodiment, at least one through-hole is formed in the wall portion of the second interposer 432, and thus the at least one conductive member may pass through the wall portion of the second interposer 432. An electronic device according to one embodiment may electrically connect an electronic component included in the first circuit board 410 to an electronic component included in the second circuit board 420 through the first interposer 430 and/or the second interposer 432 described above.

Referring to FIG. 5, as illustrated in FIG. 4, the first interposer 430 may include: a body 431 formed in a closed-curve shape so as to shield the inner space formed between the first circuit board 410 and the second circuit board 420; a conductive member 435 passing through the inside of the body 431; and a conductive frame 441 formed along the outer side surface of the body 431 surrounding the inner space formed between the first circuit board 410 and the second circuit board 420. For example, the conductive frame 441 may have a shield surface facing in a third direction 43, 44, 45, and/or 46 substantially perpendicular to the first direction 41 or the second direction 42. The conductive frame 441 is a band-shaped component in which the shielding surface is elongated in one direction, and may surround the inner space of a laminated-type PCB substrate. According to various embodiments, the inner space surrounded by the conductive frame 441 may be substantially sealed, but an unsealed structure having a minute groove or slit therein is also usable, provided that the unsealed structure guarantees a shielding effect. The conductive frame 441 may shield the inner space of the laminated-type PCB structure, which is formed by the first interposer 430.

According to various embodiments, the conductive frame 441 may be disposed on the circuit board 410 so as to surround the at least one electronic component 450. According to one embodiment, the conductive frame 441 may be electrically connected to a ground portion of the circuit board 410.

According to various embodiments, the second interposer 432 may be disposed in the inner space formed by the first interposer 430, the first circuit board 410, and the second circuit board 420 so as to divide the inner space. For example, the second interposer 432 may be disposed in the inner space so as to divide the inner space into the first region 430A and the second region 430B. The electronic component 450 may be arranged in each of the regions into which the inner space is divided by the second interposer 432. For example, a first electronic component 451 may be disposed in the first region 430A separated by the second interposer 432, and a second electronic component 452 and a third electronic component 453 may be arranged in the second region 430B.

According to one embodiment, the first interposer 430 may be formed to have a first height, and the second interposer 432 may be formed to have a second height. In one embodiment, the first height and the second height may be equal to each other, but are not limited thereto.

According to one embodiment, the second interposer 432 may support at least a portion of the second circuit board 420. The second interposer 432 may support at least a portion of the second circuit board 420 and thus may play the role of preventing the second circuit board 420 from warping.

Figure 6:
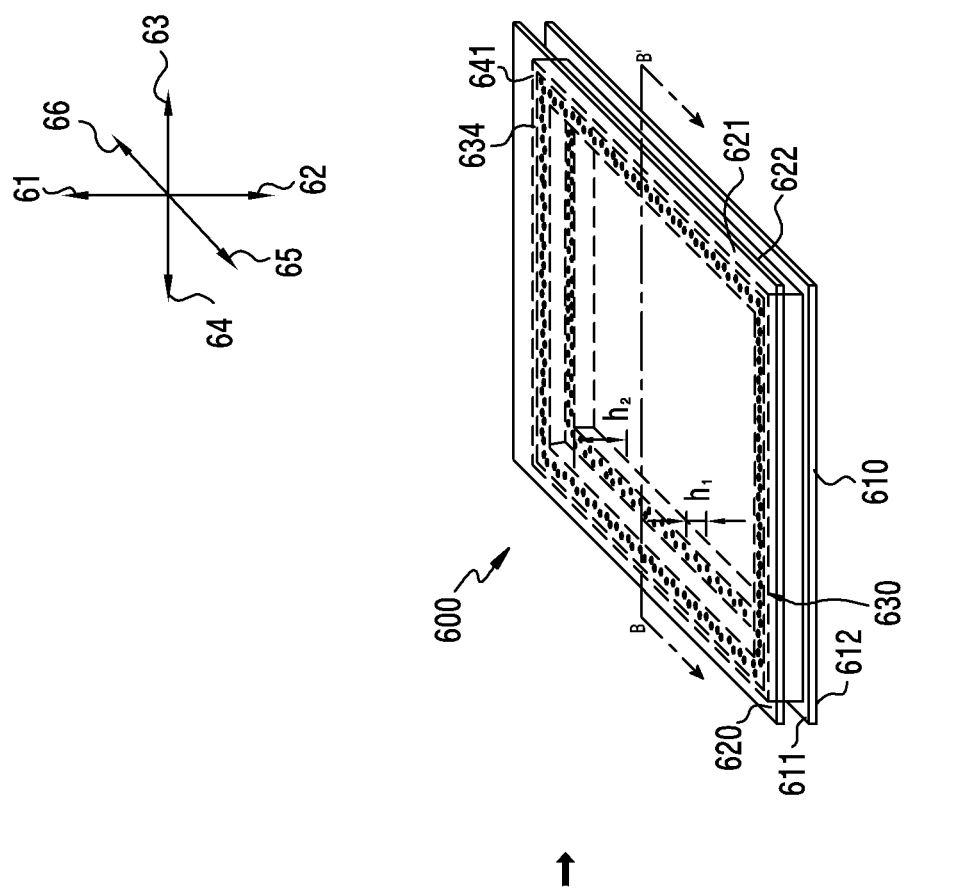
FIG. 6 is a perspective view illustrating a circuit board on which an interposer including a stepped portion is disposed according to an embodiment of the disclosure.
Figure 6:
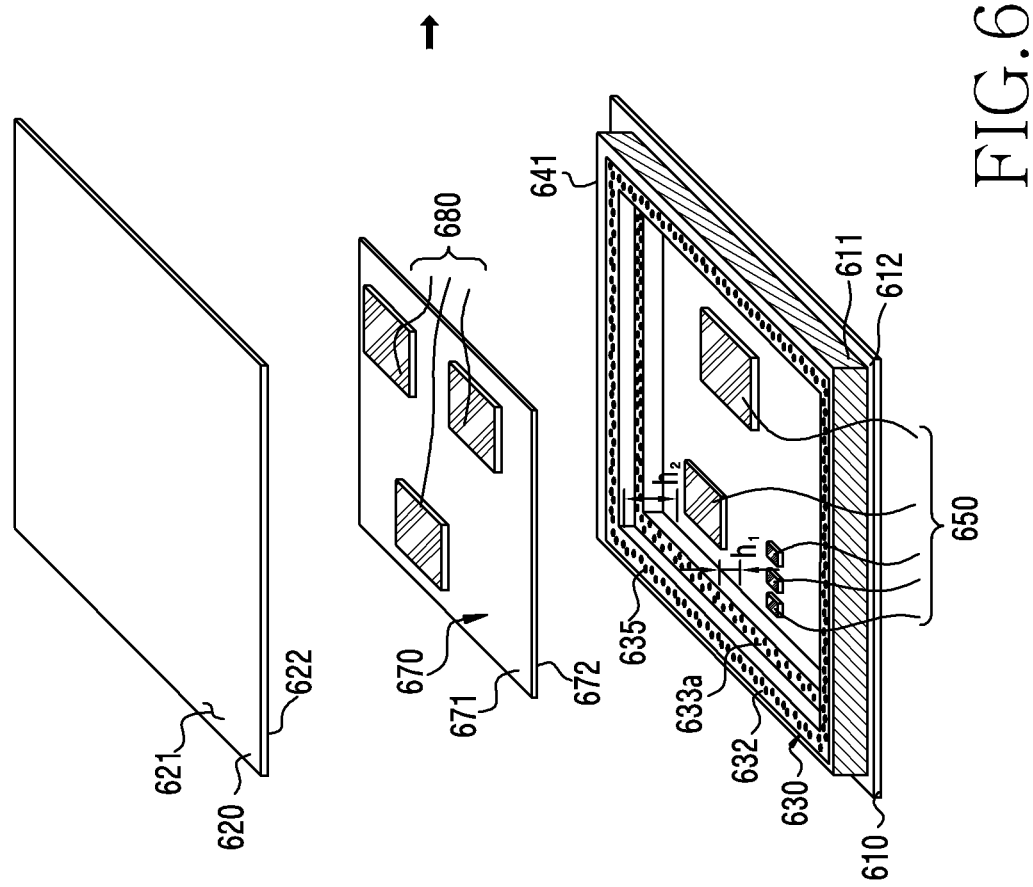

FIG. 6 is a perspective view illustrating a circuit board on which an interposer including a stepped portion is disposed according to an embodiment of the disclosure.

Referring to FIG. 6, an electronic device 600 may include a first circuit board 610 (e.g., the printed circuit board 240 in FIG. 3), a second circuit board 620, a third circuit board 670, and an interposer 630 having a multi-step structure.

According to various embodiments, a second surface 612 of the first circuit board 610 is attached to and supported by one surface of a support member (e.g., the support member 211 in FIG. 3). At least one first electronic component 650 (e.g., the electronic component 450 in FIG. 4) may be disposed on a first surface 611 of the first circuit board 610.

According to one embodiment, a first interposer 633a may be formed to have a first height (h1), and may be disposed on the first surface 611 of the first circuit board 610. The first interposer 633a may be disposed so as to surround the at least one electronic component 650 disposed on the first surface 611 of the first circuit board 610. A second interposer 632 may be disposed on the first surface 611 of the first circuit board 610 so as to be formed outside the first interposer 633a. For example, the second interposer 632 may be formed along the outer edge of the first interposer 633a so as to surround the first interposer 633a. According to various embodiments, the second interposer 632 and the first interposer 633a may be integrated with each other.

According to various embodiments, the second interposer 632 may be formed to have a second height (h2). The second height (h2) may be greater than the first height (h1). For example, the interposer including the first interposer 633a and the second interposer 632 may be formed to be high at the outer edge thereof and may be formed be low at a side facing a region including the electronic component 650. According to various embodiments, one surface of each of the first interposer 633a and the second interposer 632 may be disposed on the first surface 611 of the first circuit board 610. Another surface of the first interposer 633a and another surface of the second interposer 632, each of which faces the surface of the interposer that is in contact with the first circuit board 610, may be formed to have different heights. For example, the interposer may include a stepped portion at the boundary between the first interposer 633a and the second interposer 632.

According to various embodiments, a second surface 622 of the second circuit board 620 may form an inner space while facing the first surface 611 of the first circuit board 610. The second surface 622 of the second circuit board 620 may be in contact with the other surface of the second interposer 632. The first circuit board 610 and the second circuit board 620 may be electrically connected to each other by the second interposer 632.

According to various embodiments, the third circuit board 670 may be formed to be smaller than the second circuit board 620. For example, the third circuit board 670 may be disposed inside the stepped portion formed by the first interposer 633a and the second interposer 632, and the second circuit board 620 may be disposed on a high surface extending from the stepped portion formed by the first interposer 633a and the second interposer 632. For example, the third circuit board 670 may be supported by the first interposer 633a, and the second circuit board 620 may be supported by the second interposer 632. A conductive member 635 included in the first interposer 633a may be connected to a wire of the first circuit board 610 and to a wire of the third circuit board 670 so as to electrically connect the circuit boards to each other.

According to various embodiments, a second surface 672 of the third circuit board 670 may form an inner space while facing the first surface 611 of the first circuit board 610. The second surface 672 of the third circuit board 670 may be in contact with the other surface of the first interposer 633a. The first circuit board 610 and the third circuit board 670 may be electrically connected to each other. According to various embodiments, the at least one electronic component 650 mounted on the first circuit board 610 may be electrically connected to an electronic component 680 (e.g., a communication circuit, an active element) mounted on the third circuit board 670 by the first interposer 633a. The third circuit board 670 may include a signal transmission wire or a power wire.

Figure 7:
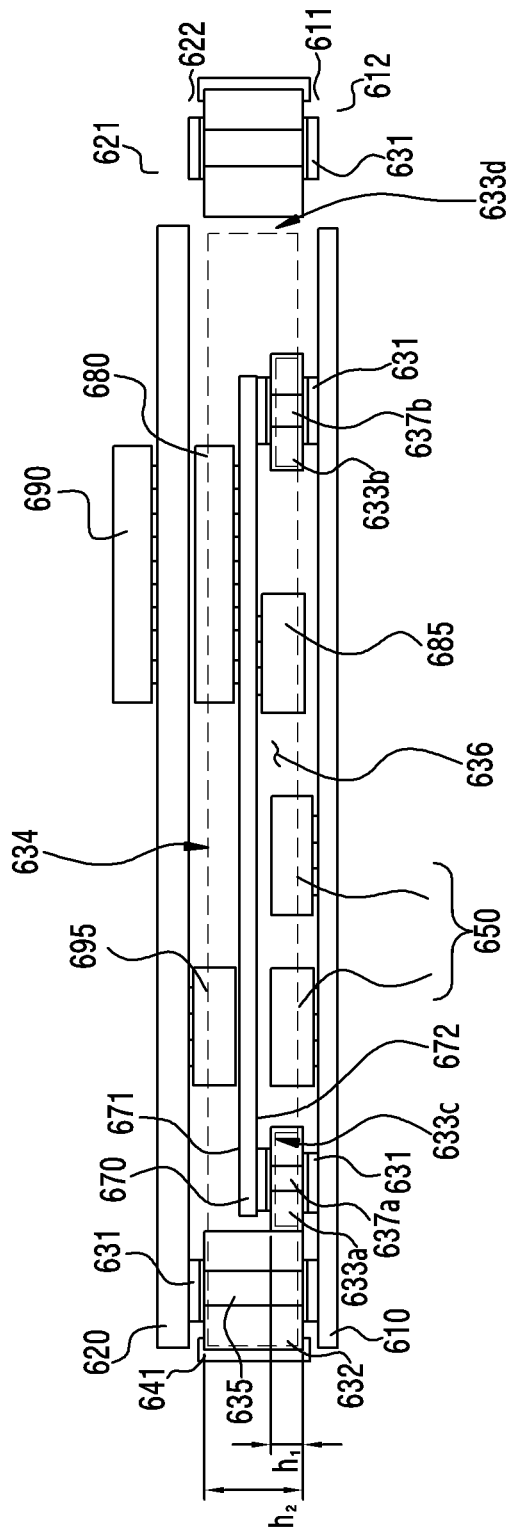
FIG. 7 is a cross-sectional view taken by cutting the circuit board of FIG. 6 in the direction B-B' according to an embodiment of the disclosure.

FIG. 7 is a cross-sectional view taken by cutting the circuit board of FIG. 6 in the direction B-B' according to an embodiment of the disclosure.

Referring to FIG. 7, the first interposer 633a, the second interposer 632, and the at least one electronic component 650 may be mounted on the first surface 611 of the first circuit board 610. An interposer (e.g., the interposer 630 in FIG. 6) may be disposed to surround the region in which the at least one electronic component 650 is disposed. For example, the interposer (e.g., the interposer 630 in FIG. 6) may be disposed outside and around the electronic component 650.

For example, the interposer 630 may include the first interposer 633a having the first height (h1) and the second interposer 632 having the second height (h2). According to various embodiments, the second interposer 632 may be disposed outside and around the first interposer 633a. The first interposer 633a and the second interposer 632 may be integrated with each other, and a stepped portion may be formed at the boundary between the first interposer 633a and the second interposer 632. One end of the first interposer 633a may be surface-mounted on the first surface 611 of the first circuit board 610. The other end of the first interposer 633a may be surface-mounted on the second surface 672 of the third circuit board 670 so as to support at least a portion of the third circuit board 670. At least one electronic component 680 or 685 may be disposed on both a first surface 671 and the second surface 672 of the third circuit board 670. According to one embodiment, the term "surface mount" refers to directly mounting a component (e.g., the first interposer 633a) on a circuit board (e.g., the third circuit board 670), and is also used below with the same meaning.

According to various embodiments, the at least one electronic component 650 disposed on the first surface 611 of the first circuit board 610 and the at least one electronic component 685 disposed on the second surface 672 of the third circuit board 670 may be arranged in the space between the third circuit board 670 and the first circuit board 610. The electronic component 650 disposed on the first surface 611 of the first circuit board 610 may be disposed so as not to interfere with the electronic component 685 disposed on the second surface 672 of the third circuit board 670.

According to various embodiments, one end of the second interposer 632 may be surface-mounted on the first surface 611 of the first circuit board 610. The other end of the second interposer 632 may be surface-mounted on at least one side of the second surface 622 of the second circuit board 620 so as to support at least a portion of the second circuit board 620. At least one electronic component 690 or 695 is disposed on both a first surface 621 and the second surface 622 of the second circuit board 620.

According to various embodiments, the electronic component 680 disposed on the first surface 671 of the third circuit board 670 and the electronic component 695 disposed on the second surface 622 of the second circuit board 620 may be arranged in the space between the second circuit board 620 and the third circuit board 670. The at least one electronic component 680 disposed on the first surface 671 of the third circuit board 670 may be disposed so as not to interfere with the electronic component 695 disposed on the second surface 622 of the second circuit board 620.

Referring to FIG. 7, according to various embodiments, the interposer (e.g., the interposer 630 in FIG. 6) including the first interposer 633a and the second interposer 632 may include a body 634, conductive members 635 and 637a, and a conductive frame 641. According to various embodiments, at least one of the elements of the interposer may be identical to or similar to at least one of the elements of the interposer of FIG. 5 (e.g., the first interposer 430 in FIG. 5), and thus a redundant description thereof will be omitted. For example, the conductive frame 641 may have a shielding surface facing in a third direction (reference numerals 63, 64, 65, and/or 66 in FIG. 6) substantially perpendicular to the first direction (e.g., reference numeral 61 in FIG. 6) or the second direction (e.g., reference numeral 62 in FIG. 6).

The conductive member 637a included in the first interposer 633a may be connected to the wire of the first circuit board 610 and to the wire of the third circuit board 670 so as to electrically connect the circuit boards to each other. Conductive pads 631 are added to respective opposite ends of the conductive member 637a. The conductive pads 631 may be in electrical contact with the wire of the first circuit board 610 and the wire of the third circuit board 670, respectively, and may transfer an electrical signal or electric power. Differing from the above description, the first interposer 633a may be formed at one inner edge of the second interposer 632. According to one embodiment, the electronic device 600 may include an additional first interposer 633b identical to the first interposer 633a having the first height (h1). According to one embodiment, the first interposer 633a may be formed in the shape of a closed curve 633c surrounding an inner space between the first circuit board 610 and the third circuit board 670. Like the first interposer 633a, the additional first interposer 633b may be formed in the shape of a closed curve 633d surrounding an inner space between the first circuit board 610 and the third circuit board 670, and may include a conductive member 637b and conductive pads 631. The first interposer 633a and the additional first interposer 633b are spaced apart from each other. Therefore, an inner space 636, in which at least one electronic component (e.g., reference numeral 650 or 685) can be disposed, may be formed between the first interposer 633*a* and the additional first interposer 633*b*.

According to various embodiments, the at least one electronic component 650 mounted on the first circuit board 610 may be electrically connected to the electronic component mounted on the second circuit board 620 by the second interposer 632. The conductive member 635 included in the second interposer 632 may be connected to the wire of the first circuit board 610 and to the wire of the second circuit board 620 so as to electrically connect the circuit boards to each other. Conductive pads 631 may be added to respective opposite ends of the conductive member 635. The conductive pads 631 may be in contact with the wire of the first circuit board 610 and the wire of the second circuit board 620, respectively, and may transfer an electrical signal or electric power.

According to various embodiments, the inner space surrounded by the conductive frame 641 may be substantially sealed, but an unsealed structure having a minute groove or slit therein is also usable, provided that the unsealed structure guarantees a shielding effect. The conductive frame 641 may shield the inner space of the laminated-type PCB structure, which is formed by the interposer 630.

According to various embodiments, the conductive frame 641 may be disposed on the circuit board 610 so as to surround the at least one electronic component 650, 680, 685, 690, and/or 695. According to one embodiment, the conductive frame 641 may be electrically connected to a ground portion of the circuit board 610.

Figure 8:
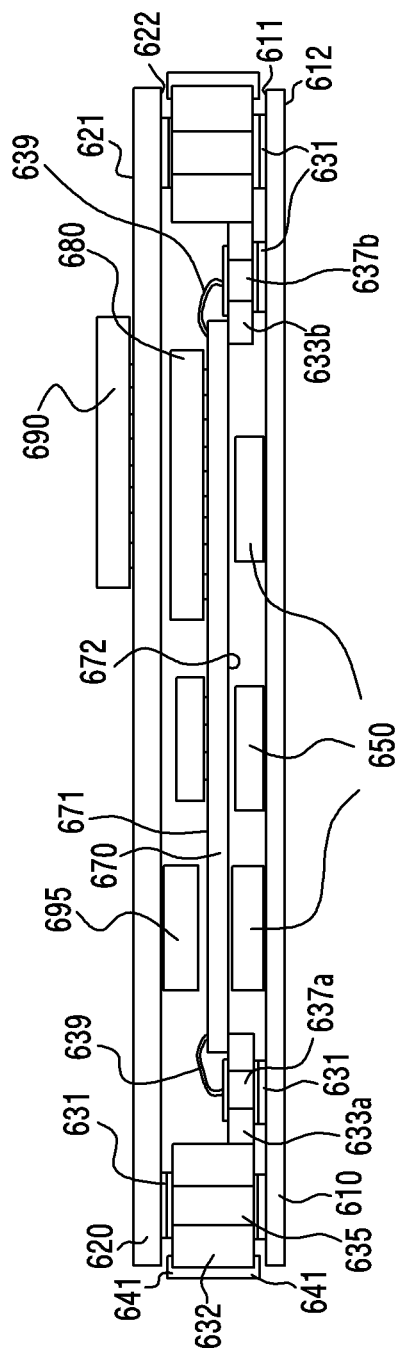
FIG. 8 illustrates modified coupling between an interposer and some substrates in a circuit board according to an embodiment of the disclosure.

FIG. 8 illustrates modified coupling between an interposer and some substrates in a circuit board according to an embodiment of the disclosure.

Referring to FIG. 8, the conductive pad 631 of the second circuit board 620, among the conductive pads 631 formed at the ends of the conductive members 638*a* and 637*b* of the first interposers 633*a* and 633*b*, may be connected to the third circuit board 670 by a conductive wire 639. According to one embodiment, the conductive wire 639 may be a bonding wire. A bonding wire may be a wire material for electrically connecting a lead on a substrate (e.g., the third circuit board 670) to a conductive pad (e.g., the conductive pads 631). In one example, the bonding wire may be formed of gold, aluminum, etc. One end of the conductive wire 639 may be connected to the wire of the third circuit board 670, and the other end of the conductive wire 639 may be connected to the conductive pads 631 formed on the first interposers 633*a* and 633*b*. Thus, the first circuit board 610 may be electrically connected to the third circuit board 670.

Figure 9:
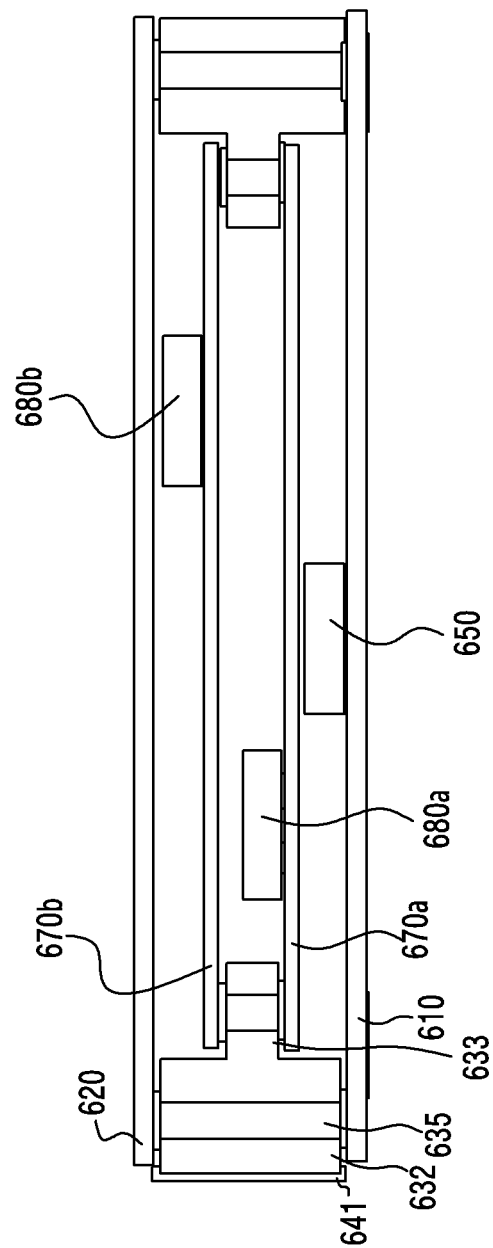
FIG. 9 illustrates a structure in which a circuit board further includes an additional circuit board according to an embodiment of the disclosure.

FIG. 9 illustrates a structure in which a circuit board further includes an additional circuit board according to an embodiment of the disclosure.

Referring to FIG. 9, a first interposer 633 may be formed to protrude from the second interposer 632. The first interposer 633 may extend from the central portion of the second interposer 632 toward an inner space. According to various embodiments, the first interposer 633 may electrically connect a third circuit board 670*a* to a fourth circuit board 670*b*. Electronic components 680*a* and 680*b* may be mounted on one surface of the third circuit board 670*a* and on one surface of the fourth circuit board 670*b*, respectively. The first interposer 633 may realize an electrical connection between the electronic components 680*a* and 680*b* which are mounted on the one surface of the third circuit board 670*a* and on the one surface of the fourth circuit board 670*b*, respectively.

Figure 10:
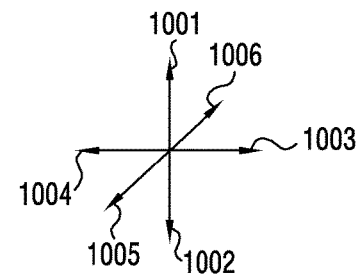
FIG. 10 is a perspective view illustrating a circuit board on which an interposer including a partition having a stepped portion is disposed according to an embodiment of the disclosure.
Figure 10:
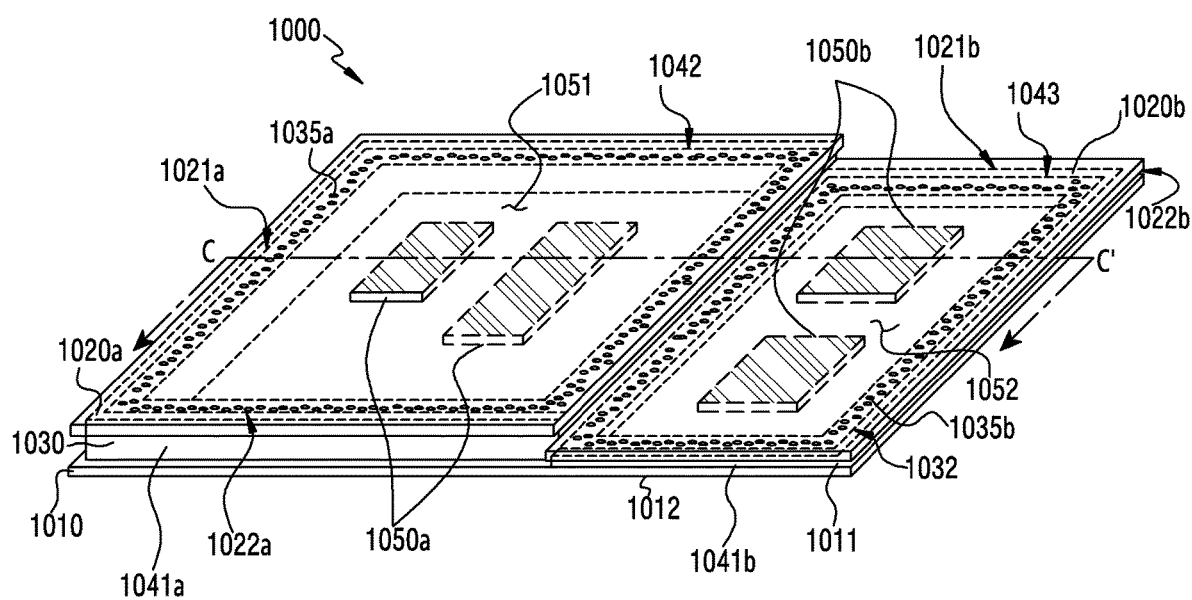

FIG. 10 is a perspective view illustrating a circuit board on which an interposer including a partition having a stepped portion is disposed according to an embodiment of the disclosure.

Referring to FIG. 10, an electronic device 1000 may include: a first circuit board 1010 (e.g., the printed circuit board 240 in FIG. 3); a second circuit board 1020*a*; a third circuit board 1020*b*; a first interposer 1030 forming an inner space between the first circuit board 1010 and the second circuit board 1020*a*; and a second interposer 1032 forming an inner space between the first circuit board 1010 and the third circuit board 1020*b*. The first interposer 1030 is formed in the shape of a closed curve (e.g., reference numeral 1042 in FIG. 11) surrounding the inner space formed between the first circuit board 1010 and the second circuit board 1020*a*, and thus the inner space, in which the first interposer 1030 is disposed, can be completely shielded. According to one embodiment, the first interposer 1030 may be formed in a shape in which a through-hole is formed in a prism having a polygonal base. The second interposer 1032 is formed in the shape of a closed curve (e.g., reference numeral 1043 in FIG. 11) surrounding the inner space formed between the first circuit board 1010 and the third circuit board 1020*b*, and thus the inner space, in which the second interposer 1032 is disposed, can be completely shielded. Like the first interposer 1030, the second interposer 1032 may be formed in a shape in which a through-hole is formed in a prism having a polygonal base.

According to one embodiment, the first interposer 1030 and the second interposer 1032 may be formed as one interposer. The one interposer may include a first wall (reference numeral 1030*a* in FIG. 11) and a second wall (reference numeral 1030*b* in FIG. 11), and a stepped portion (reference numeral 1033 in FIG. 11) may be formed between the first wall (reference numeral 1030*a* in FIG. 11) and the second wall (reference numeral 1030*b* in FIG. 11) due to the height difference between the first wall (reference numeral 1030*a* in FIG. 11) and the second wall (reference numeral 1030*b* in FIG. 11).

According to various embodiments, the first interposer 1030 may be formed to have a first height, and the second interposer 1032 may be formed to have a second height different from the first height. The height of the first interposer 1030 and the second interposer 1032 may be determined depending on the height of at least one electronic component 1050*a* and 1050*b* arranged in the inner spaces formed by the respective interposers. In one example, when one component (e.g., reference numeral 1050*a*) among the at least one electronic component has a greater height than another component (e.g., reference numeral 1050*b*) among the at least one electronic component, an interposer (e.g., the first interposer 1030) having a greater height may be formed for the electronic component (e.g., reference numeral 1050*a*) having a greater height, and an interposer (e.g., the second interposer 1032) having a relatively small height may be formed for the electronic component (e.g., reference numeral 1050*b*) having a relatively small height.

According to various embodiments, the first circuit board 1010 may include: a first surface 1011 facing in a first direction; and a second surface 1012 facing in a second direction. Various electronic components may be arranged on the first surface 1011 of the first circuit board 1010. The first circuit board 1010 may include a ground and a wire for electrically connecting one or more electronic components 1050*a* and 1050*b*. Multiple electronic components 1050*a* and 1050*b* may be mounted on the first circuit board 1010. The electronic components 1050*a* and 1050*b* mounted on the first circuit board 1010 may be arranged in an inner space 1051 formed by the first interposer 1030 or in an inner space 1052 formed by the second interposer 1032.

According to various embodiments, the second circuit board 1020*a* may include: a second surface 1022*a* facing the first surface 1011 of the first circuit board 1010; and a first surface 1021*a* facing the second surface 1022*a* of the second circuit board 1020*a*. The second circuit board 1020*a* may include an electronic component disposed on the first surface 1021*a*. According to another embodiment, an electronic component 1070 mounted on the second circuit board 1020*a* may be disposed in an inner space formed between the second circuit board 1020*a* and the first circuit board 1010. For example, an electronic component may be disposed on the second surface 1022*a* of the second circuit board 1020*a*. At least one electronic component 1070 disposed on the second surface 1022*a* of the second circuit board 1020*a* may be disposed so as to be prevented from interfering with the electronic components 1050*a* disposed on the first surface 1011 of the first circuit board 1010.

In various embodiments, the first interposer 1030 may be disposed between the first circuit board 1010 and the second circuit board 1020*a* so as to surround the inner space between the first circuit board 1010 and the second circuit board 1020*a*.

According to various embodiments, the third circuit board 1020*b* may include: a second surface 1022*b* facing the first surface 1011 of the first circuit board 1010; and a first surface 1021*b* facing the second surface 1022*b* of the third circuit board 1020*b*. At least one electronic component may be disposed on the first surface 1021*b* of the third circuit board 1020*b*. In various embodiments, the second interposer 1032 may be disposed between the first circuit board 1010 and the third circuit board 1020*b* so as to surround the inner space between the first circuit board 1010 and the third circuit board 1020*b*. According to one embodiment, the second interposer 1032 may be formed to have a second height, and the second height may be a height enabling the electronic component 1050*b* to be disposed on at least one surface of the first circuit board 1010 in the space formed by the second interposer 1032.

Figure 11:
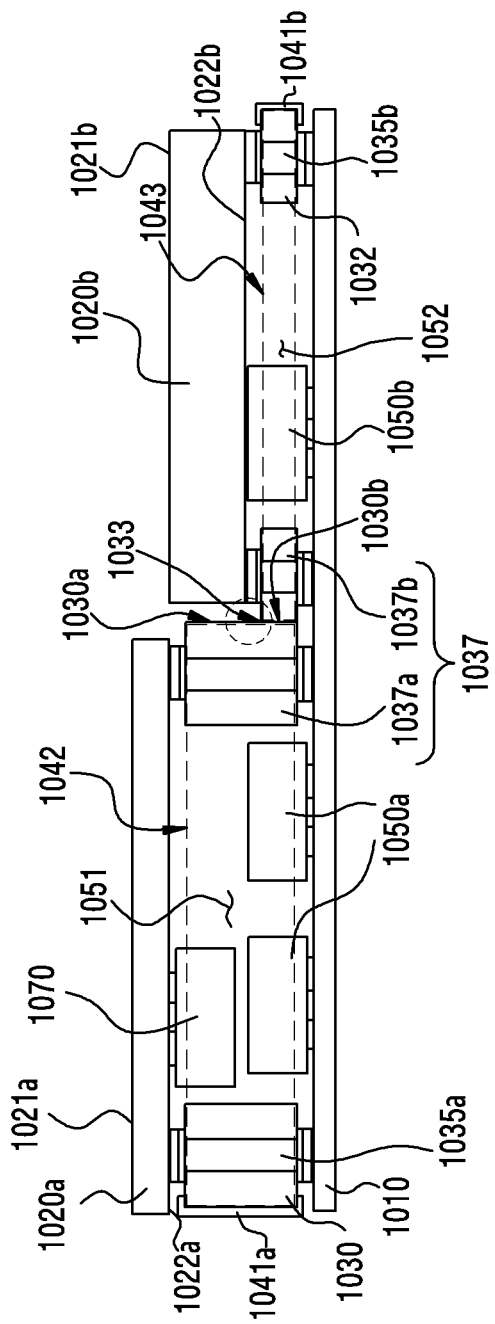
FIG. 11 is a cross-sectional view taken by cutting the circuit board of FIG. 10 in the direction C-C' according to an embodiment of the disclosure.

FIG. 11 is a cross-sectional view taken by cutting the circuit board of FIG. 10 in the direction C-C' according to an embodiment of the disclosure. FIG. 11 illustrates a configuration in which at least one interposer and a conductive member of an electronic device are arranged.

Referring to FIG. 11, the first interposer 1030 may connect the first surface 1011 of the first circuit board 1010 to the second surface 1022*a* of the second circuit board 1020*a*. The second interposer 1032 may connect the first surface 1011 of the first circuit board 1010 to the second surface 1022*b* of the third circuit board 1020*b*. The first interposer 1030 may include a conductive member 1035*a* for electrically connecting the first circuit board 1010 or at least one electronic component 1050*a* and 1050*b* included in the first circuit board 1010 to the second circuit board 1020*a* or at least one electronic component included in the second circuit board 1020*a*. The second interposer 1032 may include a conductive member 1035*b* for electrically connecting the first circuit board 1010 or the at least one electronic component 1050*a* and 1050*b* included in the first circuit board 1010 to the third circuit board 1020*b* or at least one electronic component included in the third circuit board 1020*b*. The first interposer 1030 and the second interposer 1032 include respective bodies made of non-conductive members, and may include the conductive members 1035*a* and 1035*b* (e.g., conductive vias) passing through the bodies, respectively. Some of the conductive members 1035*a* may be power lines, and the others thereof may be signal transmission lines.

According to various embodiments, the first interposer 1030 and the second interposer 1032 may be integrated with each other. The first interposer 1030 may have a first height, and the second interposer 1032 may have a second height smaller than the first height. Due to the difference in the heights, a stepped portion may be formed at the boundary between the first interposer 1030 and the second interposer 1032. A boundary region 1037 between the first interposer 1030 and the second interposer 1032, at which the stepped portion is formed, may include: a region 1037*a* having the first height and supporting the second circuit board 1020*a*; and a region 1037*b* having the second height and supporting the third circuit board 1020*b*, and the region 1037*a* and the region 1037*b* may form the stepped portion therebetween.

According to various embodiments, the first interposer 1030 is formed in the shape of a closed curve surrounding an inner space formed between the first circuit board 1010 and the second circuit board 1020*a*, and may include: a body 1042 capable of completely shielding an inner space in which the first interposer 1030 is disposed; the conductive member 1035*a* passing through the inside of the body 1042; and a first conductive frame 1041*a* formed along the outer side surface of the body 1042.

The second interposer 1032 is formed in the shape of a closed curve surrounding an inner space formed between the first circuit board 1010 and the third circuit board 1020*b*, and may include: a body 1043 capable of completely shielding an inner space in which the second interposer 1032 is disposed; the conductive member 1035*b* passing through the inside of the body 1043; and a second conductive frame 1041*b* formed along the outer side surface of the body 1043.

For example, each of the first conductive frame 1041*a* and the second conductive frame 1041*b* may have a shielding surface facing in a third direction (e.g., reference numerals 1003, 1004, 1005, and/or 1006) substantially perpendicular to the first direction (e.g., reference numeral 1001 in FIG. 10) or the second direction (e.g., reference numeral 1002 in FIG. 10). Each of the first conductive frame 1041*a* and the second conductive frame 1041*b* is a band-shaped component in which the shielding surface is elongated in one direction, and may surround a space inside a laminated-type PCB substrate.

According to various embodiments, the first conductive frame 1041*a* may be disposed on the first circuit board 1010 so as to surround the at least one electronic component 1050*a*. According to one embodiment, the first conductive frame 1041*a* may be electrically connected to a ground portion of the first circuit board 1010. The second conductive frame 1041*b* may be disposed on the first circuit board 1010 so as to surround the at least one electronic component 1050*b*, and may be electrically connected to the ground portion of the first circuit board 1010.

According to another embodiment, the first conductive frame 1041*a* and the second conductive frame 1041*b* may be integrated with each other. For example, the first conductive frame 1041*a* and the second conductive frame 1041*b* may be formed along the outside of an interposer including the first interposer 1030 and the second interposer 1032, which are integrated with each other.

Figure 12:
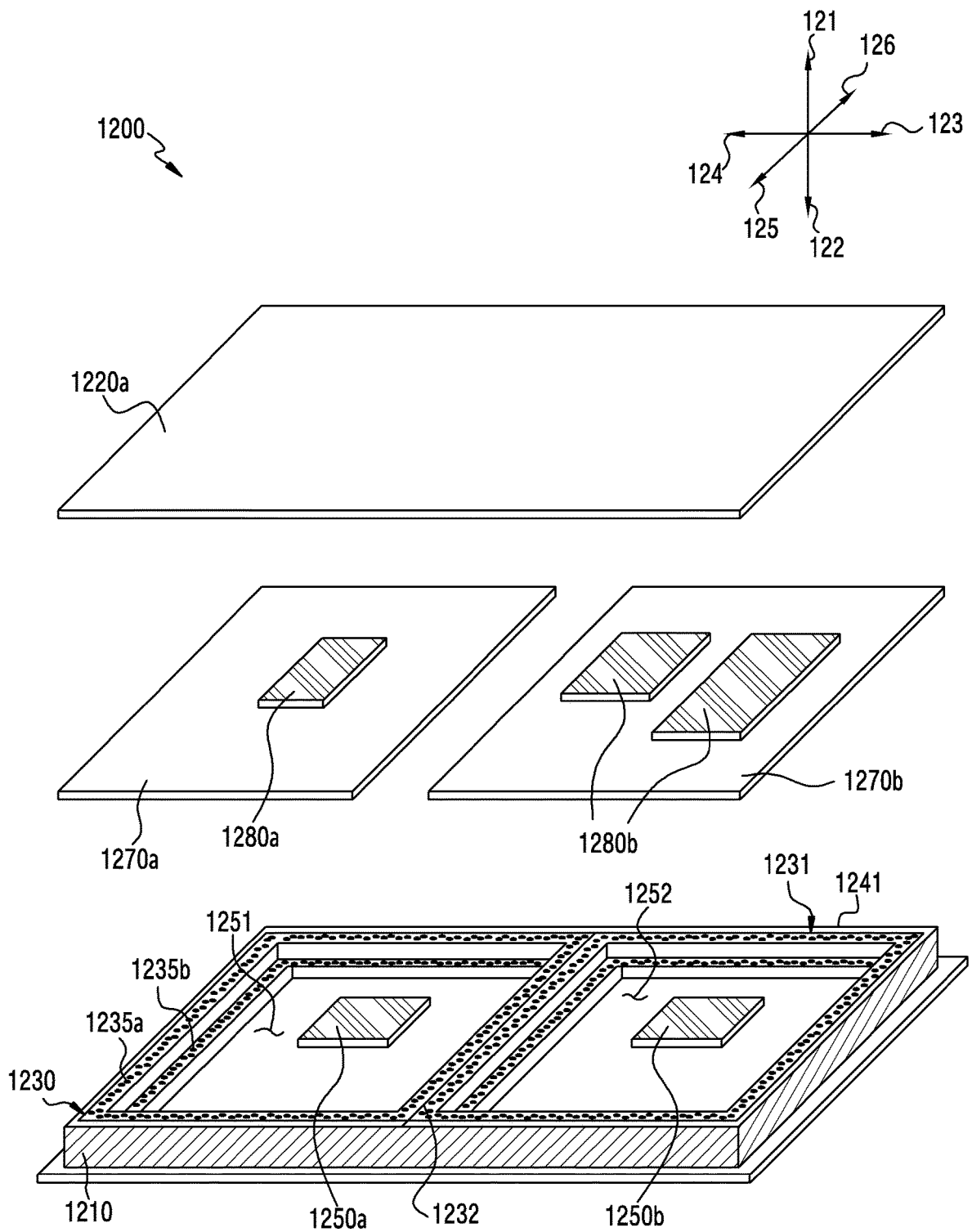
FIG. 12 is a perspective view illustrating a circuit board on which an interposer including a stepped portion and a partition is disposed according to an embodiment of the disclosure.

FIG. 12 is a perspective view illustrating a circuit board on which an interposer including a stepped portion and a partition is disposed according to an embodiment of the disclosure.

Referring to FIG. 12, an electronic device 1200 may include a first circuit board 1210, a second circuit board 1220a, a third circuit board 1270a, a fourth circuit board 1270b, and an interposer 1230.

According to various embodiments, at least one electronic component 1250a and 1250b and the interposer 1230 may be mounted on a first surface of the first circuit board 1210. One surface of the interposer 1230 may be formed such that an entirety thereof is in contact with first circuit board 1210. Another surface of the interposer 1230 may include a stepped portion to allow the second circuit board 1220a, the third circuit board 1270a, and the fourth circuit board 1270b to be arranged.

The at least one component 1250a may be installed in an inner space 1251 between the first circuit board 1210 and the third circuit board 1270a, and another component 1250b mounted on the first circuit board 1210 may be installed in an inner space 1252 between the first circuit board 1210 and the fourth circuit board 1270b. According to various embodiments, at least one electronic component 1280a or 1280b may be mounted on the third circuit board 1270a or on the fourth circuit board 1270b.

Figure 13:
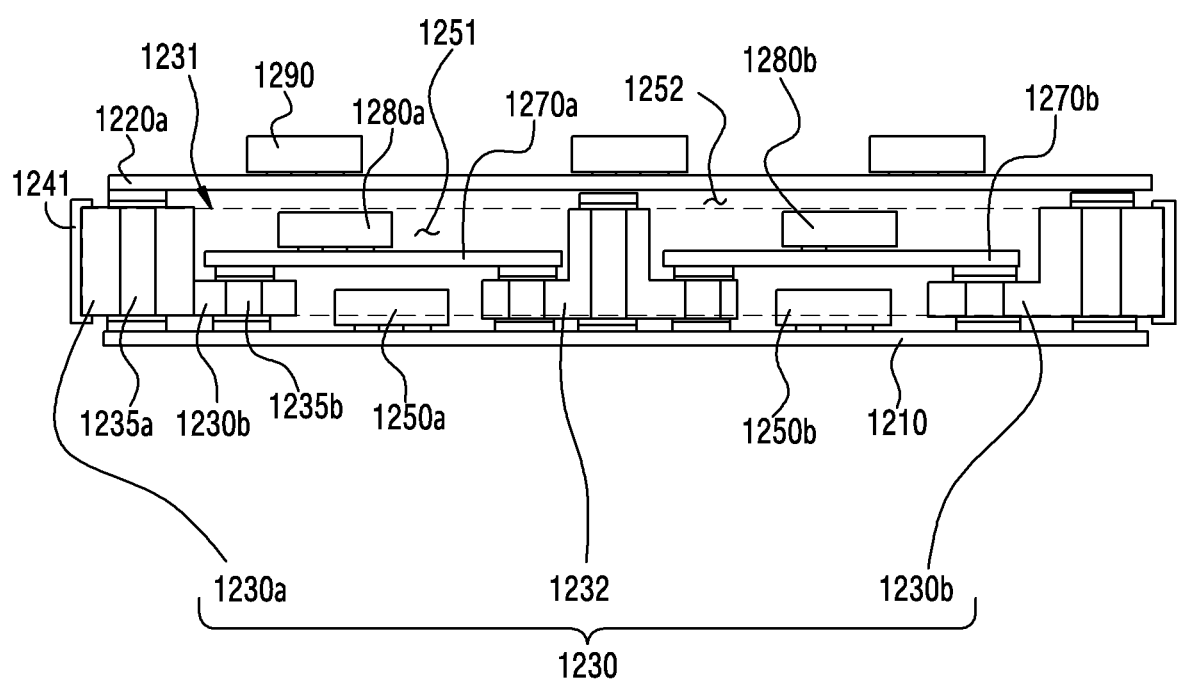
FIG. 13 is a cross-sectional view of a circuit board on which an interposer including a stepped portion and a partition is disposed according to an embodiment of the disclosure.

FIG. 13 is a cross-sectional view of a circuit board on which an interposer including a stepped portion and a partition is disposed according to an embodiment of the disclosure.

Referring to FIG. 13, the interposer 1230 may include a first interposer 1230b, a second interposer 1230a, and a third interposer 1232. The first interposer 1230b may be disposed so as to surround the electronic components 1250a and 1250b arranged on the first circuit board 1210. The first interposer 1230b may have a first height. The second interposer 1230a may be disposed on the first circuit board 1210 so as to surround the outside of the first interposer 1230b. The second interposer 1230a may have a second height, which is greater than the first height.

According to various embodiments, the second circuit board 1220a may be disposed on the second interposer 1230a. The third circuit board 1270a and the fourth circuit board 1270b may be arranged on the first interposer 1230b.

According to one embodiment, the electronic device 1200 may include the third interposer 1232, which is used as a partition. The third interposer 1232 may be disposed across an inner space formed by the first interposer 1230b so as to divide the inner space into two regions. The third interposer 1232 may support the second circuit board 1220a. The third interposer 1232 may include: a protruding region which has the second height and is in contact with the second circuit board 1220a; and a region formed around the protruding region so as to support the third circuit board 1270a and the fourth circuit board 1270b.

According to various embodiments, the first circuit board 1210 may include: the at least one electronic component 1250a disposed in a space formed between the first circuit board 1210 and the third circuit board 1270a; and the at least one electronic component 1250b disposed in a space formed between the first circuit board 1210 and the fourth circuit board 1270b. The at least one electronic component 1250a and 1250b may be disposed in respective regions separated by the third interposer 1232. According to various embodiments, the electronic component 1280a disposed in a space formed between the third circuit board 1270a and the second circuit board 1220a may be mounted on the third circuit board 1270a. The electronic component 1280b disposed in a space formed between the fourth circuit board 1270b and the second circuit board 1220a may be disposed on the fourth circuit board 1270b. The third circuit board 1270a and the fourth circuit board 1270b may be arranged to be symmetric to each other with reference to the third interposer 1232. At least one electronic component 1290 may be disposed on the second circuit board 1220a on the outside of a PCB-laminated structure.

According to various embodiments, the interposer 1230 is formed in the shape of a closed curve surrounding an inner space formed between the first circuit board 1210 and the second circuit board 1220a. The interposer 1230 may include: a body 1231 capable of shielding an inner space in which the interposer 1230 is disposed; conductive members 1235a and 1235b passing through the inside of the body 1231; and a conductive frame 1241 formed along the outer side surface of the body 1231. For example, the conductive frame 1241 may have a shielding surface facing in a third direction (e.g., reference numerals 123, 124, 125, and/or 126 in FIG. 12) substantially perpendicular to the first direction (e.g., reference numeral 121 in FIG. 12) or the second direction (e.g., reference numeral 122 in FIG. 12). The conductive frame 1241 is a band-shaped component in which the shielding surface is elongated in one direction, and may surround the inner space of a laminated-type PCB substrate. The conductive frame 1241 may be disposed on the first circuit board 1210 so as to surround the at least one electronic component 1250a, 1250b, 1280a, and 1280b. According to one embodiment, the conductive frame 1241 may be electrically connected to a ground portion of the first circuit board 1210.

According to one embodiment, the third interposer 1232 may support at least a portion of the second circuit board 1220a. The third interposer 1232 supports the second circuit board 1220a and thus can prevent the second circuit board 1220a from warping.

An electronic device according to the various embodiments described above may use an interposer formed in a multi-step structure, in a partition structure, or in a combination thereof to divide the inner space of a laminated-type PCB and to secure a vertical mounting space.

An electronic device according to various embodiments may prevent noise interference between electronic components mounted in regions separated by a multi-step structure. An electronic device including an interposer having a multi-step partition structure may increase the efficiency of arrangement of electronic components in the narrow inner space in the electronic device.

Figure 14A:
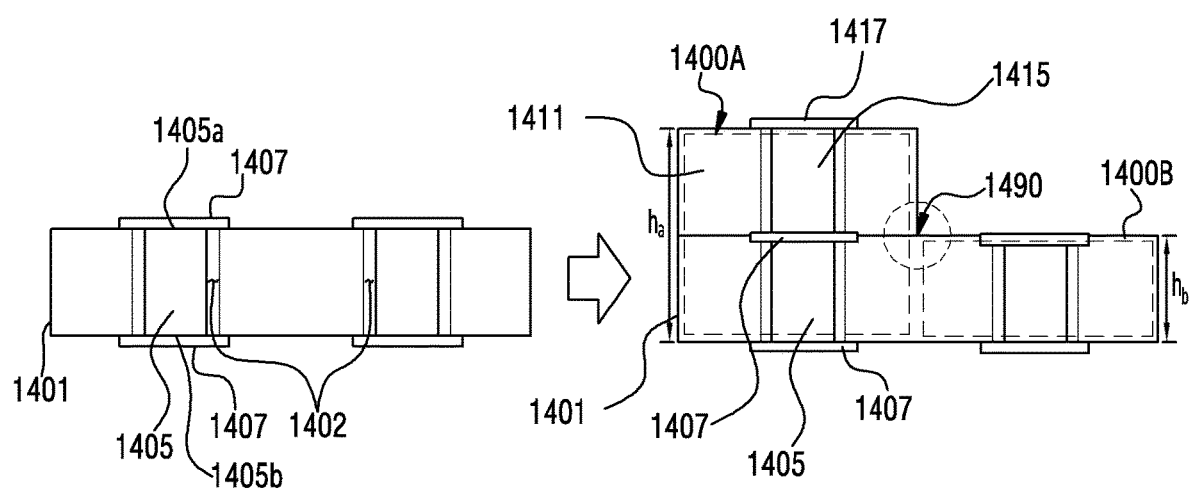
FIG. 14A illustrates the process of manufacturing an interposer including a stepped portion according to an embodiment of the disclosure.
Figure 14B:
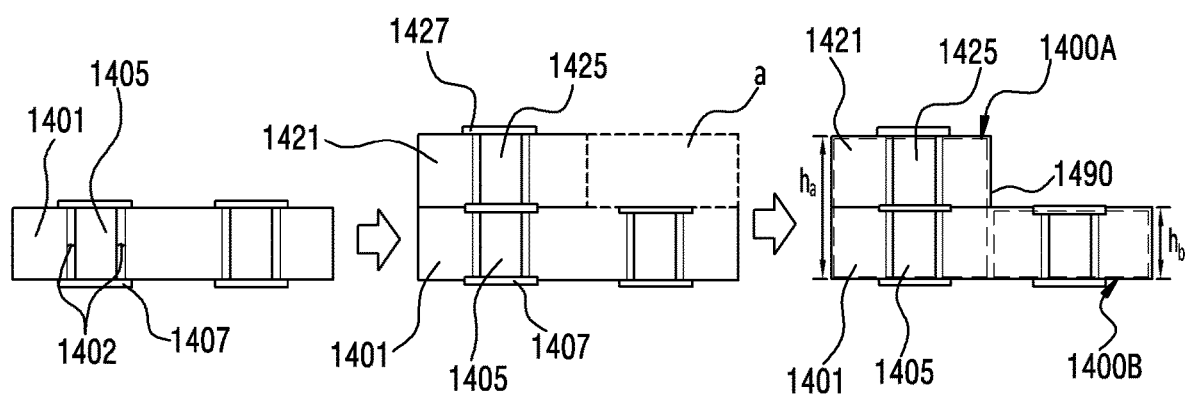
FIG. 14B illustrates the process of manufacturing an interposer including a stepped portion according to an embodiment of the disclosure.
Figure 14C:
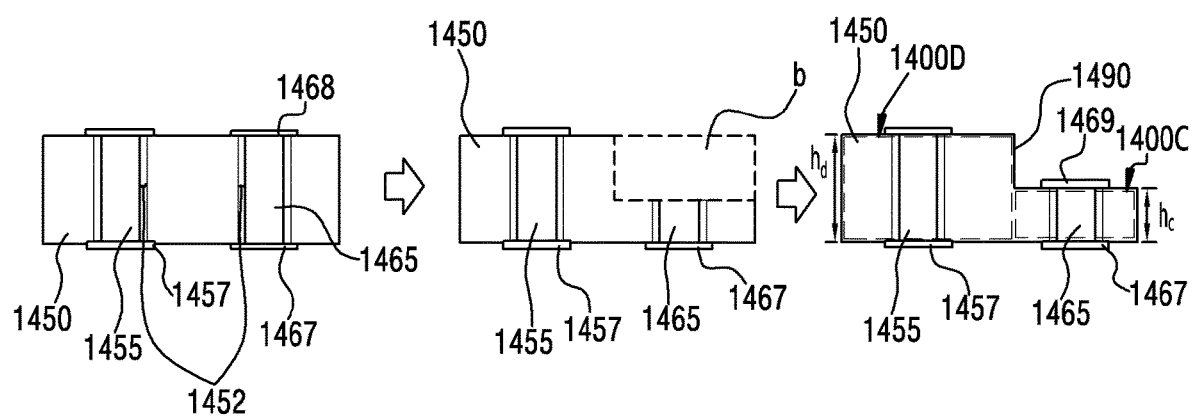
FIG. 14C illustrates the process of manufacturing an interposer including a stepped portion according to an embodiment of the disclosure.

FIG. 14A illustrates the process of manufacturing an interposer including a stepped portion according to an embodiment of the disclosure, FIG. 14B illustrates the process of manufacturing an interposer including a stepped portion according to an embodiment of the disclosure, and FIG. 14C illustrates the process of manufacturing an interposer including a stepped portion according to an embodiment of the disclosure.

Referring to FIG. 14A, the interposer may be formed by laminating multiple layers.

According to one embodiment, a first layer 1401 including multiple conductive members 1405 may be prepared. At least one via hole 1402 passing through the first layer 1401 may be formed through the first layer 1401. Each of the conductive members 1405 is one type of via passing through the via hole 1402, and may be disposed in the via hole 1402 to thereby pass through the first layer 1401. One surface 1405a of a first conductive member 1405 passed through the via hole 1402 may face in a first direction of the first layer 1401, and another surface 1405b of the first conductive member 1405 may face in a second direction of the first layer 1401, which is opposite to the first direction. According to one embodiment, the first conductive member 1405 may be electrically connected to a wire of each substrate in a laminated-type PCB and formed as a line for transmitting a signal or electric power. The first layer 1401 may include first conductive pads 1407 which are formed at respective opposite ends (in a direction of reference numerals 1405a and 1405b) of the first conductive member 1405. Each of the first conductive pads 1407 may operate as a terminal in contact with the wire of the substrate.

According to various embodiments, a second layer 1411 is formed on the first layer 1401. The second layer 1411 may be formed to have an area narrower than that of the first layer 1401. The second layer 1411 may include a second conductive member 1415. One end of the second conductive member 1415 may be connected to the first conductive pad 1407 formed at one end of the first conductive member 1405, and the other end of the second conductive member 1415 may be connected to a second conductive pad 1417. The second conductive member 1415 may be connected to the first conductive member 1405. Further, the first layer 1401 and the second layer 1411 are formed to be different from each other, and a stepped portion 1490 may be formed between the first layer 1401 and the second layer 1411. The interposer may include: a first region 1400B having a first height (hb) and including the first layer 1401; and a second region 1400A having a second height (ha) and including the first layer 1401 and the second layer 1411. A circuit board disposed in the first region 1400B may be spaced apart from a main substrate by the first height (hb), and a circuit board disposed in the second region 1400A may be spaced apart from the main substrate by the second height (ha).

Referring to FIG. 14B, as in FIG. 14A, the first layer 1401 including the first conductive member 1405 and the first conductive pads 1407 may be prepared.

According to various embodiments, like the first layer 1401, a second layer 1421 may be a layer including a second conductive member 1425 and a second conductive pad 1427. The second layer 1421 may be disposed on the first layer 1401. An interposer having a stepped portion may be formed by removing, from the second layer 1421, a region (a) in which the stepped portion for the interposer is required. According to various embodiments, the region (a) may be removed from the second layer 1421 by a method such as laser etching or the like.

The interposer may include: a first region 1400B having a first height (hb) and including the first layer 1401; and a second region 1400A having a second height (ha) and including the first layer 1401 and the second layer 1421. A circuit board disposed in the first region 1400B may be spaced apart from a main substrate by the first height (hb), and a circuit board disposed in the second region 1400A may be spaced apart from the main substrate the second height (ha).

Referring to FIG. 14C, an interposer body 1450 having a second height may be prepared. Multiple conductive members including a first conductive member 1455 and a second conductive member 1465 may be arranged in the body 1450. The body 1450 may be formed of a non-conductive material.

According to various embodiments, the body 1450 may include at least one via hole 1452 into which each of the first conductive member 1455 and the second conductive member 1465 can be inserted. Each of the first conductive member 1455 and the second conductive member 1465 may be electrically connected to a wire of a laminated PCB and thus may operate as a line for transmitting a signal or electric power. The first conductive member 1455 may include a first conductive pad 1457 formed at each of the opposite ends thereof. The second conductive member 1465 may include conductive pads 1467 and 1468 formed at respective opposite ends thereof. In one example, the second conductive member 1465 may include: a second conductive pad 1467 formed at one end thereof that is in contact with a wire of a main circuit board; and a third conductive pad 1468 formed at the other end thereof.

According to various embodiments, a region (b) may be removed from the body 1450 by laser etching in order to form a stepped portion 1490. The region (b) removed by laser etching may include the third conductive pad 1468 and a portion of the second conductive member 1465. With the removed region (b), the conductive pad has been removed. Thus, a fourth conductive pad 1469 may be formed at the other end of the second conductive member 1465 which has been partially removed.

An interposer may include: a first region 1400C obtained by removing the region (b) so as to have a first height (hc); and a second region 1400D which has a second height (hd) and in which the body 1450 retains its original form. A circuit board disposed in the first region 1400C may be spaced apart from a main substrate by the first height (hc), and a circuit board disposed in the second region 1400D may be spaced apart from the main substrate by the second height (hd).

According to various embodiments, an electronic device (e.g., the electronic device 600 in FIG. 6) may include: a first circuit board (e.g., the first circuit board 610 in FIG. 6); a first interposer (e.g., the first interposer 633a in FIG. 6) disposed on the first circuit board and having a first height (e.g., the first height (h1) in FIG. 6); a second circuit board (e.g., the third circuit board 670 in FIG. 6) disposed on the first interposer and electrically connected to the first interposer; a second interposer (e.g., the second interposer 632 in FIG. 6) disposed on the first circuit board so as to be formed outside the first interposer and having a second height (e.g., the second height (h2) in FIG. 6); and a third circuit board (e.g., the second circuit board 620 in FIG. 6) disposed on the second interposer and electrically connected to the second interposer.

According to one embodiment, the first interposer may be formed in a closed-curve shape (e.g., see FIG. 7). The second interposer may be formed in a closed-curve shape (e.g., see FIG. 7) corresponding to the shape of the first interposer, and may be disposed adjacent to the first interposer.

According to one embodiment, the first height may be smaller than the second height.

According to one embodiment, the electronic device may further include a third interposer (e.g., the third interposer 1232 in FIGS. 12 and 13) disposed across an inner space formed by the first interposer, the first circuit board, and the second circuit board.

According to one embodiment, the third interposer may be formed to have the first height so as to support at least a portion of the second circuit board.

According to one embodiment, the third interposer may partially protrude to the second height so as to support at least a portion of the third circuit board.

According to one embodiment, the first interposer may include: a first conductive member (e.g., the conductive member 637a in FIG. 7) configure to connect the first circuit board to the second circuit board; and a first through-hole (e.g., the via hole 1402 in FIG. 14A) in which the first conductive member is disposed. The second interposer may include: a second conductive member (e.g., the conductive member 635 in FIG. 7) configured to connect the first circuit board to the third circuit board; and a second through-hole (e.g., the via hole 1402 in FIG. 14A) in which the second conductive member is disposed.

According to one embodiment, the first interposer may include contact pads (e.g., the conductive pads 631 in FIG. 7) formed at respective opposite ends of the first conductive member. The second interposer may include contact pads (e.g., the conductive pads 631 in FIG. 7) formed at respective opposite ends of the second conductive member.

According to various embodiments, an electronic device (e.g., the second electronic device 400 or 1200 in FIG. 4 or 13) may include: a first circuit board (e.g., the first circuit board 410 or 1210 in FIG. 4 or 13); a first interposer (e.g., the first interposer 430 or 1230b in FIG. 4 or 13) disposed on the first circuit board and having a first height; a second circuit board (e.g., the second circuit board 420 in FIG. 4) disposed on the first interposer and electrically connected to the first interposer; and a partition (e.g., the second interposer 432 in FIG. 4 or the third interposer 1232 in FIG. 13) disposed inside the first interposer and formed to support at least a portion of the second circuit board.

According to one embodiment, the electronic device may further include: a second interposer (e.g., the second interposer 1230a in FIG. 13) having a second height and disposed on the first circuit board so as to be formed outside the first interposer; and a third circuit board (e.g., the second circuit board 1220a in FIG. 13) disposed on the second interposer and electrically connected to the second interposer.

According to one embodiment (see FIG. 12), the first interposer may be formed in a closed-curve shape, and the second interposer may be in a closed-curve shape corresponding to the shape of the first interposer and may be disposed adjacent to the first interposer.

According to one embodiment, the first height may be smaller than the second height.

According to one embodiment, the partition may include a third interposer (e.g., the third interposer 1232 in FIG. 13) formed to have the first height so as to support at least a portion of the second circuit board.

According to one embodiment, the third interposer may partially protrude to the second height so as to support at least a portion of the third circuit board.

According to one embodiment, the partition may include a third interposer formed to have the first height, and the third interposer may electrically connect the first circuit board and the second circuit board to each other.

According to one embodiment, the first interposer may include: a first conductive member (e.g., the conductive member 1235b in FIG. 13) configured to connect the first circuit board to the second circuit board; and a first through-hole (e.g., the via hole 1402 in FIG. 14A) in which the first conductive member is disposed. The second interposer may include: a second conductive member (e.g., the conductive member 1235a in FIG. 13) configured to connect the first circuit board to the third circuit board; and a second through-hole (e.g., the via hole 1402 in FIG. 14A) in which the second conductive member is disposed.

According to various embodiments, an electronic device (e.g., the electronic device 1000 in FIGS. 10 and 11) may include: a first circuit board (e.g., the first circuit board 1010 in FIG. 11) which includes a first surface (e.g., the first surface 1011 in FIG. 11), on which one or more components are disposed and which faces in a first direction (e.g., reference numeral 1001 in FIG. 10), and a second surface (e.g., the second surface 1012 in FIG. 11) facing in the opposite direction of the first direction; a first interposer which is disposed on the first surface of the first circuit board, is electrically connected to the first circuit board, and includes a first region having a first height with reference to the first surface of the first circuit board and a second region having a second height with reference to the first surface; a second interposer which is disposed on the first surface of the first circuit board, is electrically connected to the first circuit board, and includes a third region (e.g., reference numeral 1037b in FIG. 11) having the first height with reference to the first surface of the first circuit board; a second circuit board (e.g., the third circuit board 1020b in FIG. 11) which faces the first surface of the first circuit board and is disposed on the first region of the first interposer and on the third region of the second interposer; and a third circuit board (e.g., the second circuit board 1020a in FIG. 11) which faces the first surface of the first circuit board and is disposed on the second region of the first interposer.

According to one embodiment, the first interposer is formed by a closed curve surrounding at least some components (e.g., the electronic components 1050a and 1050b in FIG. 10) among the one or more components. The first height may be smaller than the second height, and the first region may be disposed toward the inside of the closed curve of the first interposer.

According to one embodiment, the second interposer may include a fourth region (e.g., reference numeral 1037a in FIG. 11), which is formed across a closed curve formed by the first interposer and has the second height with reference to the first surface, and the fourth region may support the third circuit board.

According to one embodiment, the second interposer may be connected to one edge of the first interposer to form a closed curve, and the first region may be connected to the third region.

According to various embodiments, an electronic device may include a first circuit board including a first electronic component and a second electronic component disposed on a side of the first circuit board, a second circuit board spaced apart from the first circuit board and having a side facing the side of the first circuit board on which the first electronic component and the second electronic component are disposed, a first interposer disposed between the first circuit board and the second circuit board to form an inner space between the first circuit board and the second circuit board and a second interposer disposed between the first circuit board and the second circuit board to divide the inner space into a first region and a second region, the first electronic component on the first circuit board may be disposed corresponding to the first region, and the second electronic component on the first circuit board may be disposed corresponding to the second region and the first interposer and the second interposer may electrically connect the first circuit board to the second circuit board.

According to one embodiment, the first interposer may comprise a plurality of wall portions including more than one wall portion that are each disposed along peripheral portion of the first circuit board and the second circuit board, and the inner space may be substantially enclosed by the first circuit board, the second circuit board and the first interposer.

According to one embodiment, the second interposer may comprise a wall portion disposed across the inner space and extending from one of the plurality of wall portions of the first interposer to another one of the plurality of wall portions of the first interposer.

According to one embodiment, each of the plurality of wall portions of the first interposer may have a height which is equal to a height of the wall portion of the second interposer.

According to one embodiment, the first interposer may comprise a closed curve-shaped body configured to surround the inner space, a plurality of conductive members passing through the body; and a plurality of through-holes in which the plurality of conductive members are disposed.

According to one embodiment, the closed curve-shaped body may comprise a non-conductive member in which the plurality of through-holes are disposed; and a conductive frame disposed along the non-conductive member and forming an outer side surface of the closed curve-shaped body, the conductive frame configured to shield the inner space.

According to one embodiment, the conductive frame may be electrically connected to a ground.

According to one embodiment, the second interposer may comprise a body, a plurality of conductive members passing through the body and a plurality of through-holes in which the plurality of conductive members are disposed.

According to one embodiment, the body may comprise a non-conductive member in which the plurality of through-holes are disposed.

According to one embodiment, the first circuit board may comprise a first surface facing in a first direction, the first surface being the side of the first circuit board on which the first electronic component and the second electronic component are disposed and a second surface facing in a second direction.

According to one embodiment, the first direction may be opposite the second direction.

According to one embodiment, the second circuit board may comprise a third surface facing in the first direction and a fourth surface facing the first surface of the first circuit board, the fourth surface being the side of the second circuit board facing the side of the first circuit board on which the first electronic component and the second electronic component are disposed.

According to one embodiment, the electronic device may further comprise a third electronic component disposed on the third surface of the second circuit board.

According to one embodiment, the first interposer and the second interposer may electrically connect the first electronic component and the second electronic component arranged on the first circuit board and the third electronic component disposed on the second circuit board.

According to one embodiment, the electronic device may further comprise a fourth electronic component disposed on the fourth surface of the second circuit board.

According to one embodiment, the first interposer and the second interposer electrically may connect the first electronic component and the second electronic component arranged on the first circuit board and the fourth electronic component disposed on the second circuit board. According to one embodiment, the first interposer and the second interposer may be integrated with each other.

According to one embodiment, at least one portion of the first circuit board extends past the first interposer.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1540) including one or more instructions that are stored in a storage medium (e.g., internal memory 1536 or external memory 1538) that is readable by a machine (e.g., the electronic device 1501). For example, a processor (e.g., the processor 1520) of the machine (e.g., the electronic device 1501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a non-transitory machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a first circuit board including a first electronic component and a second electronic component disposed on a first side of the first circuit board;
    a second circuit board spaced apart from the first circuit board and having a second side facing the first side of the first circuit board; and
    an interposer disposed between the first circuit board and the second circuit board including:
        a non-conductive body disposed between the first circuit board and the second circuit board,
        a plurality of through holes formed through the non-conductive body, and
        a plurality of conductive members disposed in the plurality of through holes for electrically connecting the first circuit board and the second circuit board,
    wherein the non-conductive body includes:
        a first non-conductive body having a closed-shape, and
        a second non-conductive body formed integrally extending from one portion of the first non-conductive body to another portion of the first non-conductive body to provide a first inner space and a second inner space spatially isolated from each other,
    wherein the first electronic component on the first circuit board is disposed corresponding to the first inner space, and the second electronic component on the first circuit board is disposed corresponding to the second inner space, and
    wherein a conductive portion is formed along a side surface of the second non-conductive body, the conductive portion is configured to shield the second electronic component disposed in the second inner space from the first electronic component disposed in the first inner space.

2. The electronic device of claim 1,
    wherein the first non-conductive body comprises a plurality of wall portions including more than one wall portion that are each disposed along peripheral portion of the first circuit board and the second circuit board,
    wherein the first inner space is substantially enclosed by the first circuit board, the second circuit board and the first non-conductive body,
    wherein the second non-conductive body comprises a wall portion formed of a non-conductive member, and
    wherein at least one conductive member included in the wall portion of the second non-conductive body from the plurality of conductive members is configured to shield one of the first inner space and the second inner space from the other.

3. The electronic device of claim 2, wherein the wall portion of the second non-conductive body extends from one of the plurality of wall portions of the first non-conductive body to another one of the plurality of wall portions of the first non-conductive body.

4. The electronic device of claim 3, wherein each of the plurality of wall portions of the first non-conductive body has a height which is equal to a height of the wall portion of the second non-conductive body.

5. The electronic device of claim 1, wherein conductive structure portions are electrically connected to a ground.

6. The electronic device of claim 1, wherein the first circuit board comprises:
    a first surface facing in a first direction, the first surface being the first side of the first circuit board on which the first electronic component and the second electronic component are disposed; and
    a second surface facing in a second direction.

7. The electronic device of claim 6, wherein the first direction is opposite the second direction.

8. The electronic device of claim 6, wherein the second circuit board comprises:
    a third surface facing in the first direction; and
    a fourth surface facing the first surface of the first circuit board, the fourth surface being the second side of the second circuit board facing the first side of the first circuit board on which the first electronic component and the second electronic component are disposed.

9. The electronic device of claim 8, further comprising:
    a third electronic component disposed on the third surface of the second circuit board.

10. The electronic device of claim 9, wherein the interposer electrically connects the first electronic component and the second electronic component arranged on the first circuit board and the third electronic component disposed on the second circuit board.

11. The electronic device of claim 9, further comprising:
    a fourth electronic component disposed on the fourth surface of the second circuit board.

12. An electronic device comprising:
    a first circuit board including a first electronic component and a second electronic component disposed on a side of the first circuit board;
    a second circuit board spaced apart from the first circuit board and having a side facing the side of the first circuit board on which the first electronic component and the second electronic component are disposed;
    a first interposer disposed between the first circuit board and the second circuit board to form an inner space between the first circuit board and the second circuit board; and
    a second interposer disposed between the first circuit board and the second circuit board to divide the inner space into a first region and a second region, wherein the first electronic component on the first circuit board is disposed corresponding to the first region, and the second electronic component on the first circuit board is disposed corresponding to the second region, wherein the first interposer and the second interposer comprise a plurality of through-holes in which a plurality of conductive members are disposed, wherein the first interposer comprises a closed curve-shaped body configured to surround the inner space, and a plurality of conductive members passing through the body, wherein the first circuit board and the second circuit board are electrically connected via the plurality of conductive members, wherein the first interposer comprises a plurality of wall portions including more than one wall portion that are each disposed along peripheral portion of the first circuit board and the second circuit board, wherein the inner space is substantially enclosed by the first circuit board, the second circuit board and the first interposer, wherein the second interposer comprises a wall portion formed of a non-conductive member and a conductive member disposed across the inner space, and wherein the conductive member of the wall portion of the second interposer is configured to shield one of the first region and the second region from the other.

13. The electronic device of claim 12, wherein the first circuit board comprises:
a first surface facing in a first direction, the first surface being the side of the first circuit board on which the first electronic component and the second electronic component are disposed; and
a second surface facing in a second direction.

14. The electronic device of claim 12, wherein the first interposer and the second interposer are integrated with each other.

15. The electronic device of claim 12, wherein at least one portion of the first circuit board extends past the first interposer.

16. An electronic device comprising:
a first circuit board including communication circuitry and electronic components disposed on a side of the first circuit board;
a second circuit board having a side facing the side of the first circuit board on which the communication circuitry and electronic components are disposed; and
an interposer including a non-conductive body disposed between the first circuit board and the second circuit board, a plurality of conductive members disposed in the non-conductive body for electrically connecting the first circuit board and the second circuit board, and conductive structure portions formed along an inner side surface and an outer side surface of the non-conductive body, wherein the interposer includes a first interposer portion having a closed curve-shape to form an inner space between the first circuit board and the second circuit board, and a second interposer portion formed to divide the inner space into a first inner sub-space and a second inner sub-space spatially isolated from each other, and wherein the conductive structure portions corresponding to the second interposer portion are configured to shield the electronic components disposed in the first inner sub-space from the communication circuitry disposed in the second inner sub-space.

17. The electronic device of claim 16, wherein at least one of the conductive structure portions formed along the side surfaces of the non-conductive body is electrically connected to a ground of the first circuit board.

18. The electronic device of claim 17, wherein the non-conductive body comprises a plurality of through-holes in which the plurality of conductive members are disposed.

19. The electronic device of claim 16, wherein the non-conductive body comprises a plurality of through-holes in which the plurality of conductive members are disposed.

* * * * *